US010649337B2

(12) United States Patent
Sato et al.

(10) Patent No.: US 10,649,337 B2
(45) Date of Patent: May 12, 2020

(54) POSITIVE TYPE LITHOGRAPHIC PRINTING PLATE PRECURSOR, METHOD OF PRODUCING SAME, AND METHOD OF PREPARING LITHOGRAPHIC PRINTING PLATE

(71) Applicant: FUJIFILM CORPORATION, Minato-ku, Tokyo (JP)

(72) Inventors: Takashi Sato, Shizuoka (JP); Rena Mukaiyama, Shizuoka (JP); Yuichi Yasuhara, Shizuoka (JP)

(73) Assignee: FUJIFILM CORPORATION, Tokyo (JP)

( * ) Notice: Subject to any disclaimer, the term of this patent is extended or adjusted under 35 U.S.C. 154(b) by 0 days.

(21) Appl. No.: 16/351,513

(22) Filed: Mar. 13, 2019

(65) Prior Publication Data
US 2019/0212652 A1 Jul. 11, 2019

Related U.S. Application Data

(63) Continuation of application No. PCT/JP2017/032371, filed on Sep. 7, 2017.

(30) Foreign Application Priority Data

Sep. 29, 2016 (JP) .................................. 2016-192050
Mar. 21, 2017 (JP) .................................. 2017-054715

(51) Int. Cl.
*G03F 7/30* (2006.01)
*G03F 7/033* (2006.01)
*G03F 7/035* (2006.01)
*G03F 7/095* (2006.01)
*G03F 7/032* (2006.01)
*G03F 7/11* (2006.01)
*G03F 7/00* (2006.01)
*G03F 7/004* (2006.01)
*B41C 1/10* (2006.01)

(52) U.S. Cl.
CPC .......... *G03F 7/3078* (2013.01); *B41C 1/1016* (2013.01); *G03F 7/00* (2013.01); *G03F 7/004* (2013.01); *G03F 7/032* (2013.01); *G03F 7/033* (2013.01); *G03F 7/035* (2013.01); *G03F 7/095* (2013.01); *G03F 7/11* (2013.01); *B41C 2201/04* (2013.01); *B41C 2201/14* (2013.01); *B41C 2210/02* (2013.01); *B41C 2210/06* (2013.01); *B41C 2210/262* (2013.01)

(58) Field of Classification Search
None
See application file for complete search history.

(56) References Cited

U.S. PATENT DOCUMENTS

| 7,014,983 | B1* | 3/2006 | Patel | ..................... | B41C 1/1016 |
|---|---|---|---|---|---|
| | | | | | 430/271.1 |
| 2003/0108817 | A1 | 6/2003 | Patel et al. | | |
| 2003/0162127 | A1* | 8/2003 | Kikuchi | ................ | B41C 1/1016 |
| | | | | | 430/275.1 |
| 2004/0101780 | A1 | 5/2004 | Maemoto | | |
| 2005/0014644 | A1* | 1/2005 | Ray | ........................ | B41C 1/1016 |
| | | | | | 503/201 |
| 2005/0202342 | A1 | 9/2005 | Nagashima | | |
| 2007/0128546 | A1* | 6/2007 | Saraiya | ................. | B41C 1/1008 |
| | | | | | 430/271.1 |
| 2013/0052589 | A1* | 2/2013 | Hayashi | ................. | B41N 3/034 |
| | | | | | 430/287.1 |
| 2013/0089818 | A1* | 4/2013 | Iwai | ..................... | B41C 1/1008 |
| | | | | | 430/285.1 |
| 2017/0173938 | A1* | 6/2017 | Nozaki | ..................... | G03F 7/00 |
| 2018/0311989 | A1* | 11/2018 | Sato | ........................ | B41N 1/08 |

(Continued)

FOREIGN PATENT DOCUMENTS

| EP | 2106907 A2 | 10/2009 |
|---|---|---|
| EP | 2159049 A1 | 3/2010 |
| JP | 2003-156850 A | 5/2003 |

(Continued)

OTHER PUBLICATIONS

International Search Report issued in International Application No. PCT/JP2017/032371 dated Dec. 5, 2017.

(Continued)

*Primary Examiner* — William B Perkey
(74) *Attorney, Agent, or Firm* — Solaris Intellectual Property Group, PLLC

(57) ABSTRACT

Provided is a positive type lithographic printing plate precursor including at least: a support which has a hydrophilic surface or a hydrophilic layer; and an underlayer, an interlayer, and an upper layer on the support in this order, in which the underlayer contains a polymer compound 1 which has at least one structure selected from the group consisting of a urethane bond, an acetal structure, and a urea bond in a main chain, the interlayer contains a polymer compound 2 which has at least one structure selected from the group consisting of a sulfonamide group, an active imide group, and a urea bond in a side chain, the upper layer contains a polymer compound 3 which has a phenolic hydroxy group, and one or more layers among the underlayer, the interlayer, and the upper layer contain an infrared absorbent. Further, provided are a method of producing the positive type lithographic printing plate precursor and a method of preparing a lithographic printing plate using the positive type lithographic printing plate precursor.

13 Claims, No Drawings

(56) References Cited

U.S. PATENT DOCUMENTS

2019/0212652 A1\* 7/2019 Sato ..................... B41C 1/1016

FOREIGN PATENT DOCUMENTS

| | | |
|---|---|---|
| JP | 2004-157459 A | 6/2004 |
| JP | 2004-157460 A | 6/2004 |
| JP | 2005-17599 A | 1/2005 |
| JP | 2005-91703 A | 4/2005 |
| JP | 2005-258070 A | 9/2005 |
| JP | 2006-154512 A | 6/2006 |
| JP | 2007-256537 A | 10/2007 |
| JP | 2012-78457 A | 4/2012 |
| WO | 01/46318 A1 | 6/2001 |
| WO | 2015/151632 A1 | 10/2015 |
| WO | 2015/152209 A1 | 10/2015 |

OTHER PUBLICATIONS

Written Opinion of the ISA issued in International Application No. PCT/JP2017/032371 dated Dec. 5, 2017.
English language translation of the following: Office action dated Jul. 9, 2019 from the JPO in a Japanese patent application No. 2018-542334 corresponding to the instant patent application.
Extended European Search Report dated Oct. 29, 2019, issued in corresponding EP Patent Application No. 17855666.8.

\* cited by examiner

POSITIVE TYPE LITHOGRAPHIC PRINTING PLATE PRECURSOR, METHOD OF PRODUCING SAME, AND METHOD OF PREPARING LITHOGRAPHIC PRINTING PLATE

CROSS-REFERENCE TO RELATED APPLICATIONS

This application is a Continuation of International Application No. PCT/JP2017/032371 filed on Sep. 7, 2017, which claims priority to Japanese Patent Application No. 2016-192050 filed on Sep. 29, 2016, and Japanese Patent Application No. 2017-054715 filed on Mar. 21, 2017. The entire contents of these applications are incorporated herein by reference.

BACKGROUND OF THE INVENTION

1. Field of the Invention

The present disclosure relates to a positive type lithographic printing plate precursor, a method of producing the same, and a method of preparing a lithographic printing plate.

2. Description of the Related Art

In the related art, various photosensitive compositions have been used as visible image forming materials or lithographic printing plate materials. Particularly, in recent years, lasers in the field of lithographic printing have been remarkably developed, and in particular, solid-state lasers and semiconductor lasers having an emission region in a near infrared region to an infrared region, with a high output and a small size, have become easily available. In the field of lithographic printing, as an exposure light source at the time of plate-making directly from digital data from a computer or the like, these lasers are very useful.

A positive type lithographic printing plate precursor for an infrared laser has an alkali-soluble binder resin and an infrared absorbent (for example, an infrared absorbing dye (IR dye)) and the like which absorb light and generate heat, as indispensable components. In the unexposed portion (image area), this IR dye and the like act as a development restrainer which substantially decreases the solubility of a binder resin in a developer due to an interaction between the IR dye and the like and the binder resin, and in the exposed portion (non-image area), the interaction between the IR dye and the like and the binder resin weakens due to generated heat, the IR dye and the like are dissolved in an alkaline developer, and as a result, a lithographic printing plate is formed.

SUMMARY OF THE INVENTION

As the performance required for a positive type lithographic printing plate precursor, for example, the developability of an exposed portion, the printing durability of a lithographic printing plate to be obtained, and the resistance to chemicals such as a plate cleaner used during printing are exemplified. In response to such a requirement, high printing durability is obtained in some cases by performing a high-temperature heat treatment (a so-called burning treatment) on a positive type lithographic printing plate precursor after exposure and development.

Further, ultraviolet curable ink (UV ink) to be dried (cured) by irradiation with ultraviolet (UV) light has high productivity because UV ink can be instantaneously dried, is environmentally friendly because the content of a solvent in UV ink is typically small or UV ink does not contain a solvent, and does not need to be heated so that the application range expands, and thus UV ink has been attracting attention in recent years.

Accordingly, as a lithographic printing plate, since a lithographic printing plate precursor is required to have a balance between oil-based ink printing durability, stain resistance, and developability at a high level and to also have a balance between printing durability and stain resistance at a high level in UV ink printing, a method of improving the printing durability of UV ink and the printing durability of normal ink has been sought.

Further, it has been known that a printing plate with excellent printing durability is obtained by using a urea polymer or urethane polymer, or an acetal resin as one of binder resins (for example, see WO2015/151632A and WO2015/152209A). However, in a case where a burning treatment is performed in order to further improve the chemical resistance and the printing durability of the printing plate obtained by using a urea polymer or a urethane polymer, the polymer is decomposed due to heating and thus the printing durability and the chemical resistance are degraded in some cases.

Further, it has been known that high chemical resistance is obtained by using a polymer compound to which a unit with high chemical resistance has been introduced as one of binder resins (for example, see WO01/046318A and JP2004-157459A). However, such a polymer has degraded printing durability compared to those of the above-described polymers.

Therefore, a technique for improving the chemical resistance without performing a burning treatment on a printing plate obtained by using a binder resin which has high printing durability and degraded chemical resistance has been desired.

Further, a positive type lithographic printing plate precursor for an infrared laser contains an infrared absorbent as a photothermal conversion agent for image formation, and an image recording layer is formed of a single layer or two layers which are an upper layer and an underlayer in many cases. In both cases, in a case where the amount of the infrared absorbent to be added is increased in order to improve the image forming sensitivity, a phenomenon called ablation, in which low-molecular components are volatilized or scattered due to heat generation during exposure and thus the inside of an exposure machine is contaminated, occurs. In order to deal with this, it has been suggested that ablation is suppressed by providing an interlayer (barrier layer) between the upper layer and the underlayer and allowing only the underlayer to contain an infrared absorbent (see JP2003-156850A). However, such an interlayer is insufficient from the viewpoint of the chemical resistance. Further, the printing durability becomes insufficient in some cases by means of the polymer compound contained in the underlayer which has been suggested.

An object of an embodiment of the present invention is to provide a positive type lithographic printing plate precursor from which a lithographic printing plate with excellent chemical resistance and printing durability is obtained without performing a burning treatment even in a case where a binder resin (such as a urea resin or a urethane resin) with low chemical resistance is used for an underlayer.

Further, another object of an embodiment of the present invention is to provide a method of producing the positive type lithographic printing plate precursor and a method of preparing a lithographic printing plate obtained by using the positive type lithographic printing plate precursor.

Means for solving the above-described problems includes the following aspects.

<1> A positive type lithographic printing plate precursor comprising at least: a support which has a hydrophilic surface or a hydrophilic layer; and an underlayer, an interlayer, and an upper layer provided on the support in this order, in which the underlayer contains a polymer compound 1 which is insoluble in water and soluble in an alkali aqueous solution and has at least one structure selected from the group consisting of a urethane bond, an acetal structure, and a urea bond in a main chain, the interlayer contains a polymer compound 2 which is insoluble in water and soluble in an alkali aqueous solution and has at least one structure selected from the group consisting of a sulfonamide group, an active imide group, and a urea bond in a side chain, the upper layer contains a polymer compound 3 which is insoluble in water and soluble in an alkali aqueous solution and has a phenolic hydroxy group, and one or more layers among the underlayer, the interlayer, and the upper layer contain an infrared absorbent.

<2> The positive type lithographic printing plate precursor according to <1>, in which the underlayer further contains the polymer compound 2.

<3> The positive type lithographic printing plate precursor according to <2>, in which the polymer compound 1 and the polymer compound 2 in the underlayer form a sea-island structure.

<4> The positive type lithographic printing plate precursor according to any one of <1> to <3>, in which the interlayer has a thickness of 5 nm or greater.

<5> The positive type lithographic printing plate precursor according to any one of <1> to <4>, in which the interlayer has a thickness of 10 nm or greater.

<6> The positive type lithographic printing plate precursor according to any one of <1> to <5>, in which the polymer compound 3 is at least one polymer compound selected from the group consisting of a phenol resin and an acetal resin containing a phenolic hydroxy group in a side chain.

<7> The positive type lithographic printing plate precursor according to any one of <1> to <6>, in which the polymer compound 3 is a novolac resin containing a phenolic hydroxy group.

<8> The positive type lithographic printing plate precursor according to any one of <1> to <7>, in which the upper layer contains an infrared absorbent.

<9> The positive type lithographic printing plate precursor according to any one of <1> to <8>, in which at least one layer of the underlayer, the interlayer, or the upper layer contains an onium salt compound.

<10> A method of producing the positive type lithographic printing plate precursor according to any one of <1> to <9>, comprising: a step of preparing a coating solution which contains the polymer compound 1 and the polymer compound 2; a step of coating a support which has a hydrophilic surface or a hydrophilic layer with the coating solution and drying the coating solution to form an underlayer and an interlayer through phase separation; and a step of forming an upper layer on the interlayer.

<11> The method of producing the positive type lithographic printing plate precursor according to <10>, in which an abundance ratio between the polymer compound 1 and the polymer compound 2 which are contained in the coating solution is in a range of 95:5 to 50:50 on a mass basis.

<12> The method of producing the positive type lithographic printing plate precursor according to <10> or <11>, in which the abundance ratio between the polymer compound 1 and the polymer compound 2 which are contained in the coating solution is in a range of 90:10 to 60:40 on a mass basis.

<13> A method of preparing a lithographic printing plate, comprising: an exposure step of imagewise-exposing the lithographic printing plate precursor according to any one of <1> to <9>; and a development step of developing the exposed lithographic printing plate precursor using an alkali aqueous solution having a pH of 8.5 to 13.5 in this order.

According to an embodiment of the present invention, it is possible to provide a positive type lithographic printing plate precursor from which a lithographic printing plate with excellent chemical resistance and printing durability is obtained without performing a burning treatment even in a case where a binder resin (such as a urea resin or a urethane resin) with low chemical resistance is used for an underlayer.

Further, according to another embodiment of the present invention, it is possible to provide a method of producing the positive type lithographic printing plate precursor and a method of preparing a lithographic printing plate obtained by using the positive type lithographic printing plate precursor.

DESCRIPTION OF THE PREFERRED EMBODIMENTS

Hereinafter, the contents of the present disclosure will be described in detail. The description of constituent elements below is made based on representative embodiments of the present disclosure in some cases, but the present disclosure is not limited to such embodiments.

Further, in the specification of the present application, the numerical ranges shown using "to" indicate ranges including the numerical values described before and after "to" as the lower limit values and the upper limit values.

In the specification of the present application, in a case where substitution or unsubstitution is not noted in regard to the notation of a group (atomic group), the group includes not only a group that does not have a substituent but also a group having a substituent. For example, the concept of an "alkyl group" includes not only an alkyl group that does not have a substituent (unsubstituted alkyl group) but also an alkyl group having a substituent (substituted alkyl group).

In addition, in the present disclosure, "% by mass" has the same definition as that for "% by weight" and "part(s) by mass" has the same definition as that for "part(s) by weight".

Further, in the present disclosure, a combination of two or more preferred aspects is a more preferred aspect.

Further, in the present disclosure, the "main chain" indicates the relatively longest bonding chain in a molecule of a polymer compound constituting a resin, and a "side chain" indicates a molecular chain branched from the main chain.

In the present disclosure, "water-insoluble" indicates that a compound is not dissolved in water at 25° C. or less than 0.1% by mass of a compound is dissolved, and "soluble in an alkali aqueous solution" indicates that 0.1% by mass or greater of a compound is dissolved in an alkali aqueous solution (pH: 10) at 25° C.

Further, the weight-average molecular weight (Mw) and the number average molecular weight (Mn) according to the present disclosure indicate a molecular weight obtained by performing detection using a gel permeation chromatography (GPC) analyzer, for which TSKgel GMHxL, TSKgel G4000HxL, and TSKgel G2000HxL (all trade names, manufactured by Tosoh Corporation) are used as columns, tetrahydrofuran (THF) as a solvent, and a differential refractometer and by performing conversion using polystyrene as a standard substance, unless otherwise specified.

Hereinafter, the present disclosure will be described in detail.

(Positive Type Lithographic Printing Plate Precursor)

A positive type lithographic printing plate precursor (hereinafter, also simply referred to as a "lithographic printing plate precursor") according to the embodiment of the present disclosure includes at least a support which has a hydrophilic surface or a hydrophilic layer, and an underlayer, an interlayer, and an upper layer on the support in this order, in which the underlayer contains a polymer compound 1 which is insoluble in water and soluble in an alkali aqueous solution and has at least one structure selected from the group consisting of a urethane bond, an acetal structure, and a urea bond in the main chain, the interlayer contains a polymer compound 2 which is insoluble in water and soluble in an alkali aqueous solution and has at least one structure selected from the group consisting of a sulfonamide group, an active imide group, and a urea bond in a side chain, the upper layer contains a polymer compound 3 which is insoluble in water and soluble in an alkali aqueous solution and has a phenolic hydroxy group, and one or more layers among the underlayer, the interlayer, and the upper layer contain an infrared absorbent.

Further, the underlayer, the interlayer, and the upper layer are layers functioning as image recording layers (photosensitive layers) as a whole.

As the result of intensive research conducted by the present inventors, it was found that a positive type lithographic printing plate precursor from which a lithographic printing plate with excellent chemical resistance and printing durability is obtained by employing the above-described configuration without performing a burning treatment even in a case where a binder resin (such as a urea resin or a urethane resin) with low chemical resistance is used.

The mechanism for obtaining the excellent effect by employing the above-described configuration is not clear, but can be speculated as follows.

In UV ink, the content of a monomer or an initiator is higher and the content of a solvent is smaller than those in oil-based ink because photocuring efficiency obtained from UV irradiation is considered to be important. Accordingly, the means for improving the printing durability of UV ink is different from the means for improving the printing durability of normal ink, and thus it is necessary for low-molecular components having a higher polarity than that of a solvent in oil-based ink, such as a monomer and an initiator, to be unlikely to be damaged (the chemical resistance is high).

It is speculated that, since a film in which infiltration of chemicals dissolving the polymer compound 1 with low chemical resistance into an underlayer is unlikely to occur is formed by forming an interlayer containing the polymer compound 2 with excellent chemical resistance on the underlayer containing the polymer compound 1 with low chemical resistance even though the printing durability of oil-based ink is excellent, the underlayer is unlikely to be damaged by UV ink.

Further, the image formability can also be improved by providing an interlayer. In a case where an interlayer is not present, the underlayer containing the polymer compound 1 with low chemical resistance is partially dissolved by the solvent in the coating solution of the upper layer during coating and drying of the upper layer and this results in interlayer mixing in some cases. However, it is speculated that infiltration of the solvent of the upper layer into the underlayer can be suppressed so that the upper layer used for forming an image upon exposure can sufficiently exhibit the function by providing an interlayer containing the polymer compound 2 with high chemical resistance.

<Underlayer>

The positive type lithographic printing plate precursor according to the embodiment of the present disclosure includes an underlayer containing the polymer compound 1 which is insoluble in water and soluble in an alkali aqueous solution and has at least one structure selected from the group consisting of a urethane bond, an acetal structure, and a urea bond in the main chain.

Preferred examples of the polymer compound 1 include a polymer compound having at least one structure selected from the group consisting of a urea bond and a urethane bond in the main chain and a polymer compound having an acetal structure in the main chain.

<<Polymer Compound Having at Least One Structure Selected from Group Consisting of Urea Bond and Urethane Bond in Main Chain>>

The polymer compound used in the present disclosure which has, in the main chain, at least one structure selected from the group consisting of a urea bond and a urethane bond is not particularly limited as long as a known polymer compound of the related art is used, and preferred examples thereof include a urea resin and a urethane resin described below.

[Urea Resin]

In the present disclosure, a polymer whose main chain is formed of a urea bond is a urea resin.

In the present disclosure, a "urea bond" is represented by Formula: —NR$^1$CONR$^2$—. In the present disclosure, R$^1$ and R$^2$ each independently represent preferably a hydrogen atom or an alkyl group having 1 to 10 carbon atoms (such as a methyl group, an ethyl group, a propyl group, an isopropyl group, a tert-butyl group, a pentyl group, a hexyl group, or a cyclohexyl group) and more preferably a hydrogen atom or an alkyl group having 5 or less carbon atoms.

A urea bond may be formed by using any means, but can also be obtained by causing a reaction between an isocyanate compound and an amine compound. Further, a urea bond may be synthesized by employing a urea compound substituted with an alkyl group containing a hydroxy group or an amino group at a terminal as a raw material, such as 1,3-bis(2-aminoethyl)urea, 1,3-bis(2-hydroxyethyl)urea, or 1,3-bis(2-hydroxypropyl)urea.

The isocyanate compound used as a raw material can be used without particular limitation as long as a polyisocyanate compound containing two or more isocyanate groups in a molecule is used, and a diisocyanate compound is preferable.

Examples of the polyisocyanate compound include 1,3-bis(isocyanatomethyl)cyclohexane, isophorone diisocyanate, trimethylene diisocyanate, tetramethylene diisocyanate, pentamethylene diisocyanate, hexamethylene diisocyanate, 1,3-cyclopentane diisocyanate, 9H-fluorene-2,7-diisocyanate, 9H-fluorene-9-one-2,7-diisocyanate, 4,4'-diphenylmethane diisocyanate, 1,3-phenylene diisocyanate, tolylene-2,4-diisocyanate, tolylene-2,6-diisocyanate, 1,3-bis(isocyanatomethyl)cyclohexane, 2,2-bis(4-isocyanatophenyl)hexafluoropropane, and 1,5-diisocyanatonaphthalene.

The amine compound used as a raw material can be used without limitation as long as the amine compound is a polyamine compound containing two or more amino groups in a molecule. Among examples thereof, a diamine compound is preferable.

Examples of the polyamine compound include 2,7-diamino-9H-fluorene, 3,6-diaminoacridine, acriflavine, acridine yellow, 2,2-bis(4-aminophenyl)hexafluoropropane, 4,4'-diaminobenzophenone, bis(4-aminophenyl) sulfone, 4,4'-diaminodiphenyl ether, bis(4-aminophenyl) sulfide, 1,1-bis(4-aminophenyl)cyclohexane, 4,4'-diaminodiphenylmethane, 3,3'-diaminodiphenylmethane, 3,3'-diaminobenzophenone, 4,4'-diamino-3,3-dimethyldiphenylmethane, 4-(phenyldiazenyl)benzene-1,3-diamine, 1,5-diaminonaphthalene, 1,3-phenylenediamine, 2,4-diaminotoluene, 2,6-diaminotoluene, 1,8-diaminonaphthalene, 1,3-diaminopropane, 1,3-diaminopentane, 2,2-dimethyl-1,3-propanediamine, 1,5-diaminopentane, 2-methyl-1,5-diaminopentane, 1,7-diaminoheptane, N,N-bis(3-aminopropyl)methylamine, 1,3-diamino-2-propanol, diethylene glycol bis(3-aminopropyl) ether, m-xylylenediamine, tetraethylenepentamine, 1,3-bis(aminomethyl)cyclohexane, benzoguanamine, 2,4-diamino-1,3,5-triazine, 2,4-diamino-6-methyl-1,3,5-triazine, 6-chloro-2,4-diaminopyrimidine, and 2-chloro-4,6-diamino-1,3,5-triazine.

Polyisocyanate may be synthesized by reacting phosgene or triphosgene with these polyamine compounds and then used as a raw material.

[Urethane Resin]

In the present disclosure, a polymer whose main chain is formed of a urethane bond is referred to as a urethane resin. In the present disclosure, a "urethane bond" is represented by Formula: —OC(=O)NR$^3$—. Here, R$^3$ represents preferably a hydrogen atom or an alkyl group having 1 to 10 carbon atoms (such as a methyl group, an ethyl group, a propyl group, an isopropyl group, a tert-butyl group, a pentyl group, a hexyl group, or a cyclohexyl group), more preferably a hydrogen atom or an alkyl group having 5 or less carbon atoms, and still more preferably a hydrogen atom or a methyl group.

A urethane bond may be formed using any means, but can be obtained by reacting an isocyanate compound with a compound containing a hydroxy group.

As the isocyanate compound used as a raw material, a polyisocyanate compound containing two or more isocyanate groups in a molecule is preferable, and a diisocyanate compound is more preferable. As the polyisocyanate compound, the polyisocyanate compound described as a raw material that forms a urea bond may be exemplified.

Examples of the compound containing a hydroxy group, which is used as a raw material, include a polyol compound, an amino alcohol compound, an aminophenol compound, and an alkylaminophenol compound. Among these, a polyol compound or an amino alcohol compound is preferable.

The polyol compound is a compound containing at least two hydroxy groups in a molecule and is preferably a diol compound. In addition, a molecule may have an ester bond or an ether bond. Examples of the polyol compound include ethylene glycol, propylene glycol, 1,4-butanediol, 1,5-pentanediol, 1,6-hexanediol, neopentyl glycol, polyethylene glycol, polytetramethylene glycol, 1,4-cyclohexane dimethanol, pentaerythritol, 3-methyl-1,5-pentanediol, poly(ethyleneadipate), poly(diethyleneadipate), poly(propyleneadipate), poly(tetramethyleneadipate), poly(hexamethyleneadipate), and poly(neopentyleneadipate).

The amino alcohol compound is a compound containing an amino group and a hydroxy group in a molecule, and a molecule may further have an ether bond. Examples of the amino alcohol include aminoethanol, 3-amino-1-propanol, 2-(2-aminoethoxy)ethanol, 2-amino-1,3-propanediol, 2-amino-2-methyl-1,3-propanediol, and 1,3-diamino-2-propanol.

It is preferable that the polymer compound used in the present disclosure which has at least one structure selected from the group consisting of a urea bond and a urethane bond in the main chain further contains an acid group.

As the acid group, at least one group selected from the group consisting of a phenolic hydroxy group, a sulfonamide group, an active imide group, and a carboxy group is preferable, and a phenolic hydroxy group or a sulfonamide group is more preferable.

The acid group may be contained in any of the main chain or a side chain of the polymer, but it is preferable that the acid group is contained in the main chain thereof.

The content of the polymer compound in the underlayer, which has at least one structure selected from the group consisting of a urea bond and a urethane bond in the main chain is preferably in a range of 10% by mass to 95% by mass, more preferably in a range of 20% by mass to 90% by mass, and still more preferably in a range of 30% by mass to 85% by mass with respect to the total mass of the underlayer.

The weight-average molecular weight of the polymer compound used in the present disclosure which has at least one structure selected from the group consisting of a urea bond and a urethane bond in the main chain is preferably in a range of 10000 to 300000, more preferably in a range of 15000 to 200000, and still more preferably in a range of 20000 to 150000.

Hereinafter, specific examples of the polymer compound used in the present disclosure which has at least one structure selected from the group consisting of a urea bond and a urethane bond in the main chain will be described, but the present disclosure is not limited to these. In Formula PU-5, the numerical values on the lower right side of the square brackets each represent a molar ratio of a constitutional unit contained. Further, in Formulae PU-1 to PU-5, the description for carbon atoms and hydrogen atoms of hydrocarbons will not be provided.

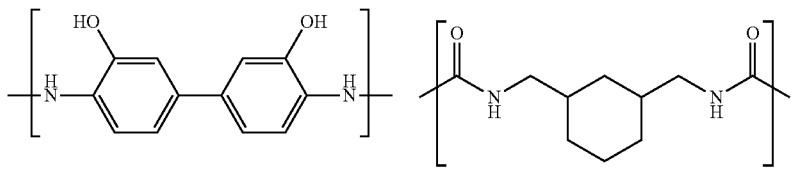

Formula PU-1

-continued

Formula PU-2
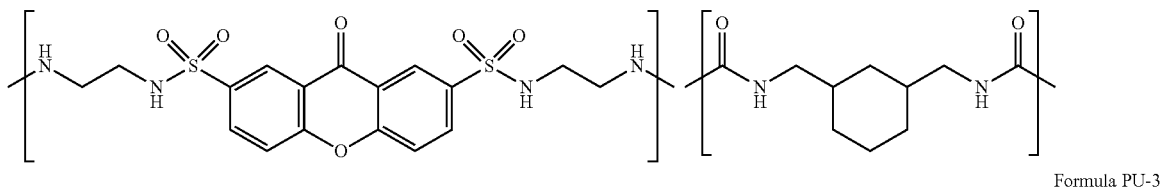

Formula PU-3
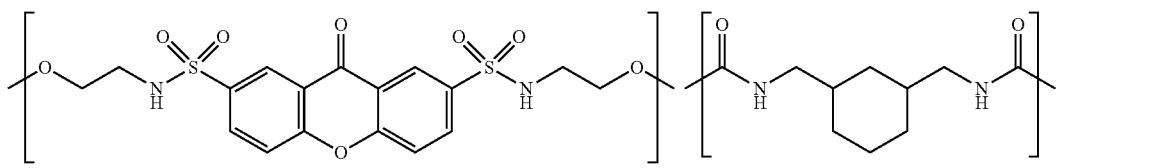

Formula PU-4
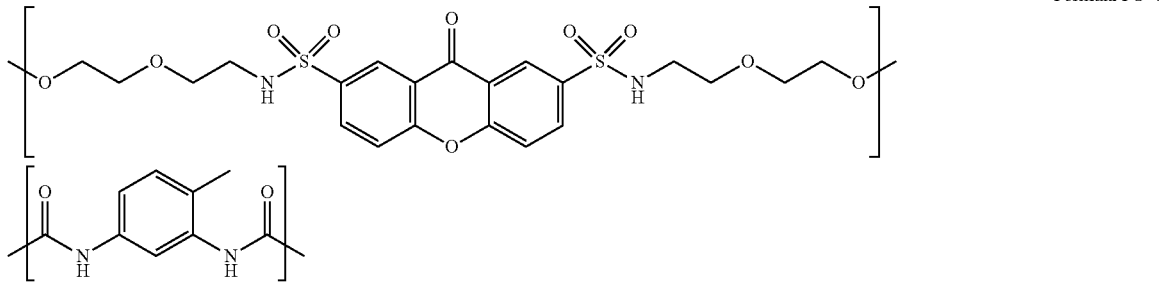

Formula PU-5
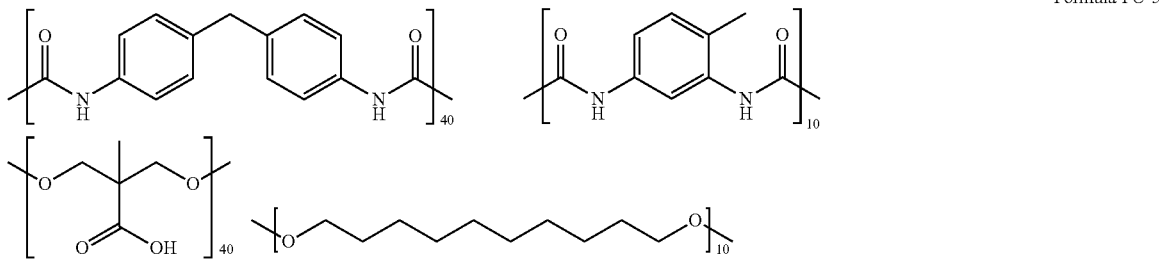

<<Polymer Compound Having Acetal Structure in Main Chain>>

In the present disclosure, polyvinyl acetal can be used as a polymer compound having an acetal structure in the main chain.

In a case where at least 50% by mole (approximately 50% by mole to approximately 75% by mole, more typically at least 60% by mole) of constitutional repeating units are acetal-containing constitutional repeating units, polyvinyl acetal has constitutional repeating units other than acetal-containing constitutional repeating units. In a case of such a polymer, non-acetal-containing constitutional repeating units may contain pendant phenol groups which are the same as or different from each other, may be constitutional repeating units that do not contain any pendant phenol groups, or may have these two types of constitutional repeating units. For example, poly(vinyl acetal) may have a constitutional repeating unit containing an itaconic acid group or a crotonic acid group. In addition, in a case where constitutional repeating units containing pendant phenol groups are present, these constitutional repeating units may contain various different phenol groups (for example, polyvinyl acetal may have an acetal-containing constitutional repeating unit and two or three or more different types of constitutional repeating units containing different pendant phenol groups). In another embodiment, a small molar amount (less than 20% by mole) of acetal groups in polyvinyl acetal can react with a cyclic anhydride or an isocyanate compound such as toluene sulfonyl isocyanate.

As the polyvinyl acetal, polyvinyl acetal containing a phenol resin (for example, a novolac resin) or approximately 40% to approximately 80% by mole of acetal-containing constitutional repeating units is exemplified. For example, polyvinyl acetal is represented by following Structure (PVAc).

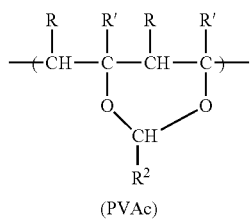

Suitable examples of the polyvinyl acetal include polyvinyl acetal which is represented by Structure (PVAc) and has at least 40% by mole to 80% by mole of constitutional repeating units based on all constitutional repeating units.

In Structure (PVAc), R and R' each independently represent a hydrogen atom or a substituted or unsubstituted and linear or branched alkyl group having 1 to 6 carbon atoms (such as a methyl group, an ethyl group, an n-propyl group, an n-butyl group, an n-pentyl group, an n-hexyl group, a chloromethyl group, a trichloromethyl group, an isopropyl group, an isobutyl group, a t-butyl group, an isopentyl group, a neo-pentyl group, a 1-methylbutyl group, or an iso-hexyl group), a substituted or unsubstituted cycloalkyl ring having 3 to 6 carbon atoms in a ring (such as a cyclopropyl group, a cyclobutyl group, a cyclopentyl group, a methylcyclohexyl group, or a cyclohexyl group), or a halogen atom (such as a fluoro group, a chloro group, a bromo group, or an iodo group). Further, R and R' each independently represent preferably a hydrogen atom, a substituted or unsubstituted methyl group, or a chloro group and more preferably a hydrogen atom or a methyl group.

Further, the groups as R and R' with different constitutional repeating units in polyvinyl acetal may be the same as or different from each other.

R² represents a substituted or unsubstituted phenol group, a substituted or unsubstituted naphthol group, or a substituted or unsubstituted anthracenol group. The phenol group, the naphthol group, and the anthracenol group may have up to three additional substituents as necessary, and examples of these additional substitutions include a hydroxy group, a methoxy group, an alkoxy group, an aryloxy group, a thioaryloxy group, a halomethyl group, a trihalomethyl group, a halogeno group, a nitro group, an azo group, a thiohydroxy group, a thioalkoxy group, a cyano group, an amino group, a carboxy group, an ethenyl group, a carboxyalkyl group, a phenyl group, an alkyl group, an alkenyl group, an alkynyl group, a cycloalkyl group, an aryl group, a heteroaryl group, and a heteroalicyclic group. Among these, R² represents preferably an unsubstituted phenol group or a naphthol group, for example, a 2-hydroxyphenyl group or a hydroxynaphthyl group.

Further, preferred polyvinyl acetal is represented by following Structure (I) having the above-described constitutional repeating unit.

-(A)$_m$-(B)$_n$—(C)$_p$-(D)$_q$-(E)$_r$-      (I)

In the formula above, A represents a constitutional repeating unit represented by following Structure (Ia).

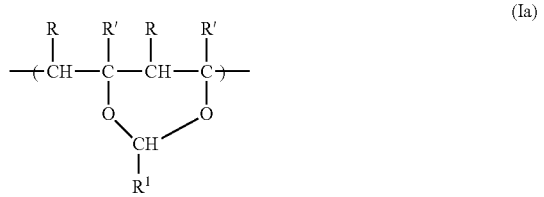
(Ia)

B represents a constitutional repeating unit represented by following Structure (Ib).

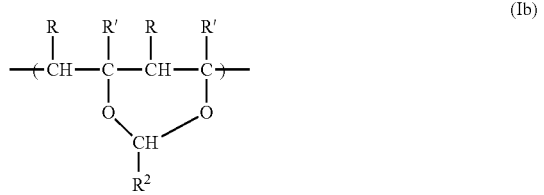
(Ib)

C represents a constitutional repeating unit represented by following Structure (Ic).

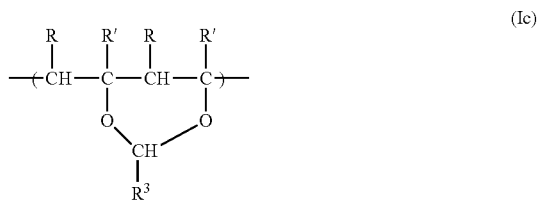
(Ic)

D represents a constitutional repeating unit represented by following Structure (Id).

(Id)

E represents a constitutional repeating unit represented by following Structure (Ie).

(Ie)

m represents preferably 5% to 40% by mole (more preferably 15% to 35% by mole), n represents preferably 10% to 60% by mole (more preferably 20% to 40% by mole), p represents preferably 0% to 20% by mole (more preferably 0% to 10% by mole), q represents preferably 1% to 20% by mole (more preferably 1% to 15% by mole), and r represents preferably 5% to 49% by mole (more preferably 15% to 49% by mole).

R, R', R¹, and R² are as defined above related to Structure (PVAc) except for the following.

R¹'s each independently represent preferably a substituted or unsubstituted alkyl group having 1 to 6 carbon atoms and more preferably an n-propyl group.

R³ represents a substituted or unsubstituted alkynyl group having 2 to 4 carbon atoms (such as an ethynyl group) or a substituted or unsubstituted phenyl group (such as a phenyl group, a 4-carboxyphenyl group, a carboxyalkyleneoxyphenyl group, or a carboxyalkylphenyl group) and preferably a carboxyalkylphenyl group, a 4-carboxyphenyl group, or a carboxyalkyleneoxyphenyl group.

R⁴ represents —O—C(=O)—R⁵, and R⁵ represents a substituted or unsubstituted alkyl group having 1 to 12 carbon atoms or a substituted or unsubstituted aryl group having 6 to 10 carbon atoms in an aromatic ring, more preferably a substituted or unsubstituted alkyl group having 1 to 6 carbon atoms, and particularly preferably a methyl group.

R⁶ represents a hydroxy group.

As indicated by the ratio between the constitutional repeating units in Structure (I), the polyvinyl acetal can be at least a tetramer depending on the number of different existing constitutional repeating units. For example, a plurality of types of constitutional repeating units formed from any of the constitutional repeating units defined by Structures (Ia) to (Ie) may be used. For example, the polyvinyl acetal in Structure (I) may have constitutional repeating units represented by Structure (Ia) having $R^1$'s which are different from one another. Such various constitutional units correspond to constitutional repeating units represented by any of Structures (Ib) to (Ie).

The polyvinyl acetal represented by Structure (I) may have constitutional repeating units other than those defined by Structures (Ia), (Ib), (Ic), (Id), and (Ie), and such constitutional repeating units are apparent to those skilled in the art. Accordingly, in the broadest sense, Structure (I) is not limited to the defined constitutional repeating units, but only the constitutional repeating units in Structure (I) are present according to some aspects.

The polyvinyl acetal described in the present specification can be prepared using known starting materials and reaction conditions described in U.S. Pat. No. 6,541,181B.

For example, polyvinyl alcohol is acetalized according to known standard methods described in U.S. Pat. No. 4,665,124A (Dhillon et al.), U.S. Pat. No. 4,690,646A (Pawlowski), U.S. Pat. No. 5,169,898A (Walls et al.), U.S. Pat. No. 5,700,619A (Dwars et al.), U.S. Pat. No. 5,792,823A (Kim et al.), and JP1997-328519A (JP-H09-328519A) (Yoshinaga).

Further, polyvinyl acetal represented by Formula VA is preferable as the polyvinyl acetal.

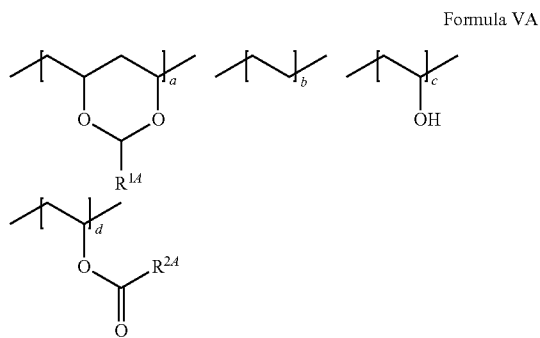

Formula VA

In Formula VA, $R^{1A}$'s each independently represent an alkyl group, an aryl group, a carboxy group, or an aryl group containing a hydroxy group, and $R^{2A}$'s each independently represent an alkyl group, and a, b, c, and d represent a molar ratio of each constitutional unit.

In Formula VA, $R^{1A}$'s each independently represent preferably an alkyl group, a carboxy group, or an aryl group containing a hydroxy group, more preferably an aryl group containing a hydroxy group, and still more preferably a 2-hydroxyphenyl group, a 3-hydroxyphenyl group, a 4-hydroxyphenyl group, a 2,3-dihydroxyphenyl group, a 2,4-dihydroxyphenyl group, a 2-hydroxy-3-methoxyphenyl group, a 2,6-dihydroxyphenyl group, a 2,4,6-trihydroxyphenyl group, a 1-(2-hydroxy)naphthyl group, a 2-(3-hydroxy)naphthyl group, or a 3-hydroxy-4-methoxyphenyl group.

In Formula VA, $R^{2A}$'s each independently represent preferably an alkyl group having 1 to 8 carbon atoms, more preferably an alkyl group having 1 to 4 carbon atoms, and particularly preferably a methyl group.

In Formula VA, a represents preferably 10% by mole to 50% by mole, more preferably 15% by mole to 45% by mole, and still more preferably 20% by mole to 35% by mole. In Formula VA, b represents preferably 15% by mole to 60% by mole, more preferably 20% by mole to 50% by mole, and still more preferably 25% by mole to 45% by mole. In Formula VA, c represents preferably 10% by mole to 60% by mole, more preferably 15% by mole to 50% by mole, and still more preferably 20% by mole to 30% by mole. In Formula VA, d represents preferably 0% by mole to 10% by mole, more preferably 0% by mole to 3% by mole, and still more preferably 0% by mole to 1% by mole.

The weight-average molecular weight (Mw) of the polyvinyl acetal used in the present disclosure is preferably 1500 or greater, more preferably in a range of 3000 to 300000, and still more preferably in a range of 10000 to 150000.

It is preferable that the polymer compound 1 is a polymer compound having at least one structure selected from the group consisting of a urea bond and a urethane bond in the main chain from the viewpoint of exhibiting higher printing durability even in a case where the film thickness is small and more preferable that the polymer compound 1 is a polymer compound having a urethane bond in the main chain from the viewpoint of alkali-solubility.

Further, the underlayer may contain components such as an infrared absorbent, an acid generator, and a surfactant described below.

From the viewpoints of the printing durability and the chemical resistance of a lithographic printing plate to be obtained, it is preferable that the underlayer further contains the polymer compound 2 described below and more preferable that the underlayer has a sea-island structure formed from at least the polymer compound 1 and the polymer compound 2.

Further, in the above-described sea-island structure, it is preferable that the polymer compound 2 forms an island (a discontinuous phase, a dispersed phase). By providing the polymer compound 2 with high chemical resistance in the underlayer to have an island shape, the chemical resistance can be improved without significantly damaging the printing durability exhibited by the polymer compound 1 having high printing durability which becomes a continuous phase (sea side). The chemical resistance is considered to be improved because infiltration of chemicals can be suppressed without reducing the original film hardness of the continuous phase due to the polymer compound 1 by distributing the polymer compound 2 in an island shape.

The underlayer may contain a single polymer compound 1 or two or more kinds of polymer compounds 1.

Further, the underlayer may contain a single polymer compound 2 or two or more kinds of polymer compounds 2.

The content of the polymer compound 1 in the underlayer is preferably in a range of 10% by mass to 95% by mass, more preferably in a range of 20% by mass to 90% by mass, and still more preferably in a range of 30% by mass to 85% by mass with respect to the total mass of the underlayer.

Further, the total content of the polymer compound 1 and the polymer compound 2 in the underlayer is preferably in a range of 20% by mass to 95% by mass, more preferably in a range of 50% by mass to 95% by mass, and still more preferably in a range of 65% by mass to 90% by mass with respect to the total mass of the underlayer.

<Interlayer>

The positive type lithographic printing plate precursor according to the embodiment of the present disclosure includes an interlayer containing a polymer compound 2 which is insoluble in water and soluble in an alkali aqueous solution and has at least one structure selected from the group consisting of a sulfonamide group, an active imide group, and a urea bond in a side chain.

It is preferable that the polymer compound 2 is different from the polymer compound 1 and is not compatible with a polymer compound. By using the polymer compound 2 that is not compatible with the polymer compound 2, an underlayer with high printing durability and an interlayer with high chemical resistance are obtained.

Further, from the viewpoints of the formability of the image recording layer and the printing durability and the chemical resistance of a lithographic printing plate to be obtained, it is preferable that the polymer compound 2 is a polymer compound different from the polymer compound 1 and the polymer compound 3.

The sulfonamide group in a side chain of the polymer compound 2 contains not only —SO$_2$NH$_2$ but also a group formed by substitution of a hydrogen atom on a nitrogen atom of a sulfonamide group with an alkyl group, an aryl group, or a heteroaryl group.

<<Polymer Compound Having at Least One Structure Selected from Group Consisting of Sulfonamide Group and Active Imide Group in Side Chain>>

As the polymer compound containing a sulfonamide group in a side chain, a polymer compound obtained by homopolymerizing a polymerizable monomer containing a sulfonamide group or copolymerizing polymerizable monomers other than the above-described monomer is exemplified. Examples of the polymerizable monomer containing a sulfonamide group include a sulfonamide group —NH—SO$_2$— formed by at least one hydrogen atom being bonded to a nitrogen atom in one molecule and a polymerizable monomer formed of a low-molecular compound having one or more polymerizable unsaturated bonds. Among these, a low-molecular compound containing an acryloyl group, an aryl group, or a hydroxy group and a substituted or unsubstituted aminosulfonyl group or a substituted sulfonylimino group is preferable.

It is preferable that an alkali-soluble resin containing an active imide group in a side chain contains an active imide group in a molecule, and examples of this polymer compound include a polymer compound obtained by homopolymerizing a polymerizable monomer formed of a low-molecular compound having one or more unsaturated bonds polymerizable with an active imide group in one molecule or copolymerizing polymerizable monomers other than the above-described monomer.

As such a compound, specifically, N-(p-toluenesulfonyl) methacrylamide, N-(p-toluenesulfonyl)acrylamide, or the like can be suitably used.

As the polymer compound 2, it is preferable to use a polymer compound obtained by copolymerizing two or more polymer monomers selected from the polymerizable monomer containing a phenolic hydroxyl group, the polymerizable monomer containing a sulfonamide group, and the polymerizable monomer containing an active imide group or a polymer compound obtained by copolymerizing other polymerizable monomers with these two or more polymerizable monomers. In a case the polymerizable monomer containing a sulfonamide group and/or the polymerizable monomer containing an active imide group is copolymerized with the polymerizable monomer containing a phenolic hydroxyl group, the mass ratio of these components to be blended is preferably in a range of 50:50 to 5:95 and particularly preferably in a range of 40:60 to 10:90.

In the present disclosure, in a case where the alkali-soluble resin is a copolymer of the polymerizable monomer containing a phenolic hydroxyl group, the polymerizable monomer containing a sulfonamide group, or the polymerizable monomer containing an active imide group and other polymerizable monomers, from the viewpoints of the alkali-solubility and the effect of improving development latitude, the content of the monomer imparting the alkali-solubility is preferably 10% by mole or greater and more preferably 20% by mole or greater with respect to the total molar amount of the monomers used for copolymerization.

Examples of the monomer components to be copolymerized with the polymerizable monomer containing a phenolic hydroxyl group, the polymerizable monomer containing a sulfonamide group, or the polymerizable monomer containing an active imide group include compounds exemplified in the following (m1) to (m12), but the present invention is not limited thereto.

(m1): Acrylic acid esters and methacrylic acid esters which contain an aliphatic hydroxyl group, such as 2-hydroxyethyl acrylate or 2-hydroxyethyl methacrylate (m2): Alkyl acrylate such as methyl acrylate, ethyl acrylate, propyl acrylate, butyl acrylate, amyl acrylate, hexyl acrylate, octyl acrylate, benzyl acrylate, 2-chloroethyl acrylate, or glycidyl acrylate (m3): Alkyl methacrylate such as methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, or glycidyl methacrylate (m4) Acrylamide or methacrylamide such as acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide, or N-ethyl-N-phenylacrylamide (m5): Vinyl ethers such as ethyl vinyl ether, 2-chloroethyl vinyl ether, hydroxyethyl vinyl ether, propyl vinyl ether, butyl vinyl ether, octyl vinyl ether, and phenyl vinyl ether (m6): Vinyl esters such as vinyl acetate, vinyl chloroacetate, vinyl butyrate, and vinyl benzoate (m7): Styrenes such as styrene, α-methylstyrene, methyl styrene, and chloromethylstyrene (m8): Vinyl ketones such as methyl vinyl ketone, ethyl vinyl ketone, propyl vinyl ketone, and phenyl vinyl ketone (m9): Olefins such as ethylene, propylene, isobutylene, butadiene, and isoprene (m10): N-vinylpyrrolidone, acrylonitrile, and methacrylonitrile (m11): Unsaturated imide such as maleimide, N-acryloylacrylamide, N-acetylmethacrylamide, N-propionyl methacrylamide, or N-(p-chlorobenzoyl)methacrylamide (m12): Unsaturated carboxylic acid such as acrylic acid, methacrylic acid, maleic acid anhydride, or itaconic acid Preferred examples of the polymer compound 2 include a polymer having at least one of a constitutional unit represented by Formula S-1 or a constitutional unit represented by Formula S-2.

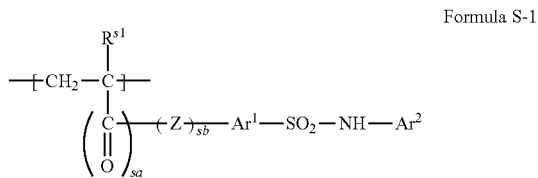

Formula S-1

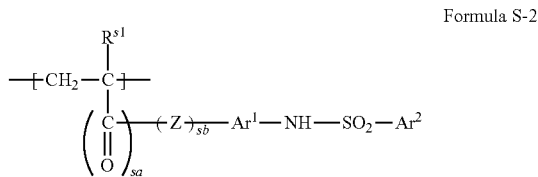

Formula S-2

In Formulae S-1 and S-2, $R^{s1}$ represents a hydrogen atom or an alkyl group. Z represents —O— or —$NR^{s2}$—. Here, $R^{s2}$ represents a hydrogen atom, an alkyl group, an alkenyl group, or an alkynyl group. $Ar^1$ and $Ar^2$ each independently represent an aromatic group and at least one of $Ar^1$ or $Ar^2$ represents a heteroaromatic group. sa and sb each independently represent 0 or 1.

In Formula S-1, $R^{s1}$ represents a hydrogen atom or an alkyl group, and the alkyl group is a substituted or unsubstituted alkyl group, but it is preferable that the alkyl group does not have a substituent. Examples of the alkyl group represented by $R^{s1}$ include lower alkyl groups such as a methyl group, an ethyl group, a propyl group, and a butyl group. It is preferable that $R^{s1}$ represents a hydrogen atom or a methyl group.

Z represents —O— or —$NR^{s2}$— and preferably —$NR^{s2}$—. Here, $R^{s2}$ represents a hydrogen atom, a substituted or unsubstituted alkyl group, a substituted or unsubstituted alkenyl group, or a substituted or unsubstituted alkynyl group, preferably a hydrogen atom or an unsubstituted alkyl group, and more preferably a hydrogen atom.

sa and sb each independently represent 0 or 1. According to a preferable aspect, sa represents 0 and sb represents 1, and both of sa and sb represent preferably 0 and most preferably 1.

More specifically, in a case where a represents 0 and b represents 1 in the above-described constitutional unit, it is preferable that Z represents O. Further, in a case where both of sa and sb represent 1, it is preferable that Z represents $NR^{s2}$. Here, it is preferable that $R^{s2}$ represents a hydrogen atom.

$Ar^1$ and $Ar^2$ each independently represent an aromatic group and at least one of $Ar^1$ or $Ar^2$ represents a heteroaromatic group. $Ar^1$ represents a divalent aromatic group and $Ar^2$ represents a monovalent aromatic group. These aromatic groups are each a substituent formed by replacing one or two hydrogen atoms constituting an aromatic ring with a linking group.

An aromatic ring and a heteroaromatic ring in such an aromatic group may be selected from hydrocarbon aromatic rings such as benzene, naphthalene, and anthracene and may be selected from heteroaromatic rings such as furan, thiophene, pyrrole, imidazole, 1,2,3-triazole, 1,2,4-triazole, tetrazole, oxazole, isoxazole, thiazole, isothiazole, thiadiazole, oxadiazole, pyridine, pyridazine, pyrimidine, pyrazine, 1,3,5-triazine, 1,2,4-triazine, and 1,2,3-triazine.

Further, a plurality of these rings may be fused to be formed into fused rings such as benzofuran, benzothiophene, indole, indazole, benzoxazole, quinoline, quinazoline, benzoimidazole, and benzotriazole.

These aromatic groups and heteroaromatic groups may further have a substituent, and examples of the substituent which can be introduced include an alkyl group, a cycloalkyl group, an alkenyl group, a cycloalkenyl group, an aryl group, a heteroaryl group, a hydroxy group, a mercapto group, a carboxy group or alkyl ester thereof, a sulfonic acid group or alkyl ester thereof, a phosphinic acid group or alkyl ester thereof, an amino group, a sulfonamide group, an amide group, a nitro group, a halogen atom, and a substituent formed by a plurality of these being bonded to one another. Further, these substituents may further have substituents exemplified here.

$Ar^2$ represents preferably a heteroaromatic group which may have a substituent and more preferably a heteroaromatic ring containing a nitrogen atom, which is selected from the group consisting of pyridine, pyridazine, pyrimidine, pyrazine, 1,3,5-triazine, 1,2,4-triazine, 1,2,3-triazine, tetrazole, oxazole, isoxazole, thiazole, isothiazole, thiadiazole, and oxadiazole.

The content of the constitutional unit (here, converted in the monomer unit) represented by Formula S-1 or S-2 is preferably in a range of 10% by mole to 100% by mole, more preferably in a range of 20% by mole to 90% by mole, still more preferably in a range of 30% by mole to 80% by mole, and particularly preferably in a range of 30% by mole to 70% by mole with respect to the total amount of the monomer units in the polymer compound.

The polymer compound containing such a constitutional unit may be a copolymer containing constitutional units other than the constitutional unit represented by Formula S-1 or S-2.

Examples of other constitutional units include a hydrophobic monomer containing a substituent such as an alkyl group or an aryl group in a side chain structure of the monomer and a hydrophilic monomer containing an acidic group, an amide group, a hydroxy group, or an ethylene oxide group in a side chain structure of the monomer, and can be appropriately selected from these depending on the purpose thereof. Further, the kinds of monomers to be copolymerized need to be selected within a range not damaging the alkali-solubility of a specific polymer.

Examples of other copolymerization components include (meth)acrylamide, N-substituted (meth)acrylamide, N-substituted maleimide, (meth)acrylic acid ester, (meth)acrylic acid ester having a polyoxyethylene chain, 2-hydroxyethyl (meth)acrylate, styrene, styrenesulfonic acid, o-, p-, or m-vinylbenzen acid, vinylpyridine, N-vinylcaprolactam, N-vinylpyrrolidine, (meth)acrylic acid, itaconic acid, maleic acid, glycidyl (meth)acrylate, hydrolyzed vinyl acetate, and vinylphosphonic acid. Among these, preferred examples of copolymerization components include N-benzyl (meth)acrylamide and (meth)acrylic acid.

The number average molecular weight (Mn) of the polymer having at least one of the constitutional unit represented by Formula S-1 or the constitutional unit represented by Formula S-2 is preferably in a range of 10000 to 500000, more preferably in a range of 10000 to 200000, and most preferably in a range of 10000 to 100000. Further, the weight-average molecular weight (Mw) thereof is preferably in a range of 10000 to 1000000, more preferably in a range of 20000 to 500000, and particularly preferably in a range of 20000 to 200000.

<<Polymer Compound Having Urea Bond in Side Chain>>

As the polymer compound having a urea bond in a side chain, a QHB-modified novolac resin described below is exemplified.

A QHB-modified novolac resin has a structural feature in which other molecules or similar or supplementary units of parts of molecules, and four or more, typically four hydrogen bonds can be formed, that is, a QHB (quadruple hydrogen bonding) unit. The QHB unit is a unit which can be bonded to another QHB unit through at least four hydrogen bonds. The polymer materials that form at least four hydrogen bonds in pairs are disclosed in U.S. Pat. No. 6,320,018B (Sijbesma). The QHB unit is preferably substantially flat and has a rigid structure. Particularly, the unit has preferably one or more flat 6-membered rings. It is preferable that the QHB unit has two continuous donor sites and continued by two accepting sites. According to one preferred embodiment, the QHB unit is an isocytosine unit (isocytosine moiety), and the QHB-modified polymer molecule has at least two isocytosine units.

The QHB-modified polymer can be produced by reacting isocytosine such as 6-alkyl isocytosine or typical 6-methyl isocytosine with isocyanate and generating an isocytosine-isocyanate adduct, that is, a quadruple hydrogen bonding entity (QHBE). The quadruple hydrogen bonding entity is allowed to react with an appropriate polymer in order to produce a QHB-modified polymer. A 6-methylisocytosine-isocyanate monoadduct, that is, QHBE is represented by the following formula.

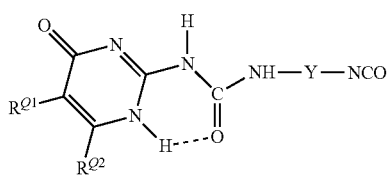

In the formula, $R^{Q1}$ represents a hydrogen atom, $R^{Q2}$ represents a methyl group, and Y represents a hydrocarbylene group derived from diisocyanate represented by Formula: $Y(NCO)_2$.

The diisocyanate is not particularly limited, and preferred examples thereof include isophorone diisocyanate, methylene bisphenyl diisocyanate, toluene diisocyanate, hexamethylene diisocyanate, tetramethylene diisocyanate, dimers of these, adducts with this diols, and mixtures of these. Among these, isophorone diisocyanate is particularly preferable.

By reacting 1 mole of isocytosine with 1 mole of isocyanate, QHBE is produced and naturally dimerized to form dimerized monoadducts bonded by four heat-reversible hydrogen bonds. The generated dimerized QHBE contains free isocyanate groups at terminals, and the isocyanate groups react with a novolac resin so that a QHB-modified novolac resin can be produced.

Unreacted diisocyanate in QHBE react with two molecules of polymer so that the polymer can be crosslinked. In order to avoid crosslinking of an unmodified polymer caused by the unreacted diisocyanate, an excess of isocyanate, that is, approximately and preferably 10% to 20% by mole of isocyanate is excessively used. However, an excess of isocyanate further reacts with QHBE to provide an adduct having two isocytosine units. In order to maximize formation of lower order adducts, isocytosine is slowly added to diisocyanate such that an excess of diisocyanate is present at an initial stage of the QHBE formation reaction.

As the polymer compound having a urea bond in a side chain, a vinyl polymerization type or polycondensation type polymer compound having a constitutional unit represented by any of Formulae (1-a) to (1-c) or a novolac resin having a urea bond in a side chain is particularly suitably exemplified. Further, from the viewpoint of improving the sensitivity, it is preferable that a functional group that contributes to the solubility in an alkali aqueous solution is present in a side chain, in addition to a urea bond.

Formula (1-a)

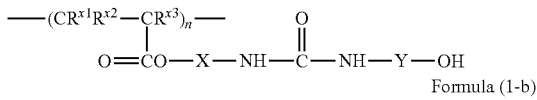

Formula (1-b)

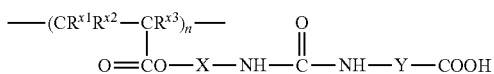

Formula (1-c)

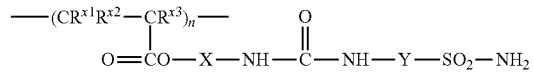

In Formulae (1-a) to (1-c), $R^{x1}$ and $R^{x2}$ each independently represent a hydrogen atom, a halogen atom, an alkyl group, an aryl group, a carboxy group, or a salt thereof. $R^{x3}$ represents a hydrogen atom, a halogen atom, an alkyl group, or an aryl group. X represents a divalent linking group, and suitable examples thereof include an alkylene group which may have a substituent and a phenylene group. Y represents a divalent aromatic group which may have a substituent, and suitable examples thereof include a phenylene group which may have a substituent and a naphthylene group.

As the content of the constitutional unit represented by any of Formulae (1-a) to (1-c) in the polymer compound, a copolymer containing corresponding monomers at a charging ratio of 10% to 80% by mole is preferable, a copolymer containing corresponding monomers at a charging ratio of 15% to 70% by mole is more preferable, and a copolymer containing corresponding monomers at a charging ratio of 20% to 60% by mole is particularly preferable.

A method of producing the polymer compound having a constitutional unit represented by any of Formulae (1-a) to (1-c) is not particularly limited, and various known methods can be used. For example, the polymer compound can be produced using a method of polymerizing a polymerizable monomer in a solvent using a polymerization initiator.

According to the method of polymerizing a polymerizable monomer in a solvent using a polymerization initiator, the polymerizable monomer is a monomer having one or more urea bonds and one or more polymerizable unsaturated bonds in one molecule, and suitable examples thereof include compounds represented by Formula (1-d).

Formula (1-d)

$$\begin{array}{c} R^{x4} \\ | \\ CH_2{=}C \\ | \\ O{=}C{-}O{-}X{-}NH{-}\overset{O}{\underset{\|}{C}}{-}NH{-}Y{-}OH \end{array}$$

In Formula (1-d), $R^{x4}$ represents a hydrogen atom or an alkyl group. X represents a divalent linking group, and examples thereof include an alkylene group which may have a substituent and a phenylene group which may have a substituent. Y represents a divalent aromatic group which may have a substituent, and examples thereof include a phenylene group which may have a substituent and a naphthylene group which may have a substituent.

Examples of the compound represented by Formula (1-d) include acrylate derivatives such as 1-(N'-(4-hydroxyphenyl)ureido)methyl acrylate, 1-(N'-(3-hydroxyphenyl)ureido)methyl acrylate, 1-(N'-(2-hydroxyphenyl)ureido)methyl acrylate, 1-(N'-(3-hydroxy-4-methylphenyl)ureido)methyl acrylate, 1-(N'-(2-hydroxy-5-methylphenyl)ureido)methyl acrylate, 1-(N'-(5-hydroxynaphthyl)ureido)methyl acrylate, 1-(N'-(2-hydroxy-5-phenylphenyl)ureido)methyl acrylate, 2-(N'-(4-hydroxyphenyl)ureido)ethyl acrylate, 2-(N'-(3-hydroxyphenyl)ureido)ethyl acrylate, 2-(N'-(2-hydroxyphenyl)ureido)ethyl acrylate, 2-(N'-(3-hydroxy-4-methylphenyl)ureido)ethyl acrylate, 2-(N'-(2-hydroxy-5-methylphenyl)ureido)ethyl acrylate, 2-(N'-(5- hydroxynaphthyl)ureido)ethyl acrylate, 2-(N'-(2-hydroxy-5-phenylphenyl)ureido)ethyl acrylate, 4-(N'-(4-hydroxyphenyl)ureido)butyl acrylate, 4-(N'-(3-hydroxyphenyl)ureido)butyl acrylate, 4-(N'-(2-hydroxyphenyl)ureido)butyl acrylate, 4-(N'-(3-hydroxy-4-methylphenyl)ureido)butyl acrylate, 4-(N'-2-hydroxy-5-methylphenyl)ureido)butyl acrylate, 4-(N'-(5-hydroxynaphthyl)ureido)butyl acrylate, and 4-(N'-(2-hydroxy-5-phenylphenyl)ureido)butyl acrylate; and methacrylate derivatives such as 1-(N'-(4-hydroxyphenyl) ureido)methyl methacrylate, 1-(N'-(3-hydroxyphenyl) ureido)methyl methacrylate, 1-(N'-(2-hydroxyphenyl) ureido)methyl methacrylate, 1-(N'-(3-hydroxy-4-methylphenyl)ureido)methyl methacrylate, 1-(N'-(2-hydroxy-5-methylphenyl)ureido)methyl methacrylate, 1-(N'-(5-hydroxynaphthyl)ureido)methyl methacrylate, 1-(N'-(2-hydroxy-5-phenylphenyl)ureido)methyl methacrylate, 2-(N'-(4-hydroxyphenyl)ureido)ethyl methacrylate, 2-(N'-(3-hydroxyphenyl)ureido)ethyl methacrylate, 2-(N'-(2-hydroxyphenyl)ureido)ethyl methacrylate, 2-(N'-(3-hydroxy-4-methylphenyl)ureido)ethyl methacrylate, 2-(N'-(2-hydroxy-5-methylphenyl)ureido)ethyl methacrylate, 2-(N'-(5-hydroxynaphthyl)ureido)ethyl methacrylate, 2-(N'-(2-hydroxy-5-phenylphenyl)ureido)ethyl methacrylate, 4-(N'-(4-hydroxyphenyl)ureido)butyl methacrylate, 4-(N'-(3-hydroxyphenyl)ureido)butyl methacrylate, 4-(N'-(2-hydroxyphenyl)ureido)butyl methacrylate, 4-(N'-(3-hydroxy-4-methylphenyl)ureido)butyl methacrylate, 4-(N'-2-hydroxy-5-methylphenyl)ureido)butyl methacrylate, 4-(N'-(5-hydroxynaphthyl)ureido)butyl methacrylate, and 4-(N'-(2-hydroxy-5-phenylphenyl)ureido)butyl methacrylate. These may be used alone or in combination of two or more kinds thereof.

The polymerizable monomer can be identified by measuring the infrared absorption spectrum because the polymerizable monomer has a characteristic absorption at 1600 cm$^{-1}$ to 1700 cm$^{-1}$ in the infrared absorption spectrum based on a urea bond. Further, the polymerizable monomer can also be identified using the melting point or proton NMR.

For example, in the above-described specific example, 2-(N'-(4-hydroxyphenyl)ureido)ethyl methacrylate has a melting point of 131° C. to 133° C. and can be identified from the IR absorption spectrum based on a hydroxyl group and the urea bond.

In addition to the compounds represented by Formula (1-d), polymerizable monomers, for example, acrylates containing acidic groups such as 2-(N'-(4-carboxyphenyl) ureido)ethyl acrylate, 2-(N'-(4-sulfamoylphenyl)ureido) ethyl acrylate, 2-(N'-(4-sulfophenyl)ureido)ethyl acrylate, and 2-(N'-(4-phosphonophenyl)ureido)ethyl acrylate; methacrylates having acidic groups such as 2-(N'-(4-carboxylphenyl)ureido)ethyl methacrylate, 2-(N'-(4-sulfamoylphenyl)ureido)ethyl methacrylate, 2-(N'-(4-sulfophenyl)ureido) ethyl methacrylate, and 2-(N'-(4-phosphonophenyl)ureido) ethyl methacrylate; acrylates free from acidic groups such as 2-(N'-methylureido)ethyl acrylate, 2-(N'-propylureido)ethyl acrylate, 2-(N'-phenylureido)ethyl acrylate, 2-(N'-(4-methylphenyl)ureido)ethyl acrylate, 2-(N'-(2-methylphenyl) ureido)ethyl acrylate, 2-(N'-naphthylureido)ethyl acrylate, and 2-(N'-(2-phenylphenyl)ureido)ethyl acrylate; and methacrylates free from acidic groups such as 2-(N'-methylureido)ethyl methacrylate, 2-(N'-propylureido)ethyl methacrylate, 2-(N'-phenylureido)ethyl methacrylate, 2-(N'-(4-methylphenyl)ureido)ethyl methacrylate, 2-(N'-(2-methylphenyl)ureido)ethyl methacrylate, 2-(N'-naphthylureido)ethyl methacrylate, 2-(N'-(2-phenylphenyl) ureido)ethyl methacrylate are preferably exemplified.

In the above-described specific examples, 2-(N'-(4-carboxyphenyl)ureido)ethyl methacrylate has a decomposition temperature of 220° C. and can also be identified from the IR absorption spectrum based on a carboxy group and the urea bond.

A method of producing the polymerizable monomer is not particularly limited, and suitable examples thereof include a known production method of reacting an isocyanate compound represented by Formula (1-e) with an amine compound represented by Formula (1-f).

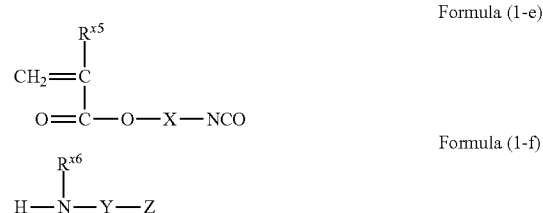

In Formula (1-e), $R^{x5}$ represents a hydrogen atom or an alkyl group. X has the same definition as that in Formula (1-d). In Formula (1-f), $R^{x6}$ represents a hydrogen atom or an alkyl group which may have a substituent. Y has the same definition as that in Formula (1-d). Z represents a hydroxy group, a carboxy group, or a sulfonamide group.

According to the production method, a polymerizable monomer represented by Formula (1-d) can be suitably obtained using a compound represented by Formula (1-e) and a compound represented by Formula (1-f), in which Z represents a hydroxyl group and $R^6$ represents a hydrogen atom.

According to the production method, since an amino group in Formula (1-f) has high activity with respect to an isocyanate group, compared to a hydroxyl group, a carboxy group, or a —NH—CO— group, a polymerizable monomer represented by Formula (1-d) can be easily obtained.

As desired, the reaction can proceed more effectively by making the amine compound represented by Formula (1-f) to be excessive and gradually adding the isocyanate compound represented by Formula (1-e) thereto.

The solvent is not particularly limited as long as a known organic solvent is used, and solvents that do not have active hydrogen atoms are suitably exemplified. Examples thereof include ethylene dichloride, cyclohexanone, methyl ethyl ketone, acetone, methanol, ethanol, ethylene glycol monomethyl ether, ethylene glycol monoethyl ether, 2-methoxy ethyl acetate, 1-methoxy-2-propanol, 1-ethoxy-2-propanol, 1-methoxy-2-propanol acetate, 1-methoxy-2-propyl acetate, 1-ethoxy-2-propyl acetate, dimethyl sulfoxide, toluene, ethyl acetate, methyl lactate, ethyl lactate, and dioxane. These may be used alone or in combination of two or more kinds thereof.

The above-described reaction may be carried out for a time until the isocyanate compound represented by Formula (1-e) disappears or the amount of the urea bond reaches a certain value, and the time is typically in a range of 15 minutes to 24 hours.

Further, the reaction temperature is preferably in a range of 0° C. to 40° C.

For the purpose of removing unreacted raw materials components or by-products in a case where the polymerizable monomer is allowed to react in an excess of an amine compound represented by Formula (1-f), as desired, the polymerizable monomer is neutralized using an acid compound such as dilute hydrochloric acid, and the amine compound represented by Formula (1-f) is formed into a salt, washed with water, filtered, and vacuum-dried so that a high purity is obtained.

The vinyl polymerization type or polycondensation type polymer compound having a constitutional unit represented by any of Formulae (1-a) to (1-c) may be a homopolymer or a copolymer of two or more of the polymerizable monomers having a urea bond (such as monomers represented by Formulae (1-a) to (1-c), but a copolymer with a compound that has one or more polymerizable unsaturated bond and does not have a urea bond is preferable from the viewpoint of the printing durability. The copolymer may have any structure of a block copolymer, a random copolymer, a graft copolymer, or the like.

From the viewpoint of exhibiting the chemical resistance, since excellent effects can be obtained as the thickness of the interlayer increases, the thickness thereof is preferably 5 nm or greater and more preferably 10 nm or greater. Further, since the developability deteriorates as the film thickness increases, the thickness of the interlayer is preferably smaller than or equal to the thickness of the underlayer, more preferably one-fourth or less, and still more preferably one-tenth or less.

As described above, the polymer compound 2 may be present in the form of an island-shaped dispersed phase in the underlayer. In a case where a dispersed phase having a high chemical resistance is present, infiltration of chemicals into the underlayer can be suppressed without significantly damaging the printing durability of a continuous phase having high printing durability.

Further, the interlayer may contain an infrared absorbent, an acid generator, a surfactant, or the like described below.

The interlayer can be obtained using, for example, the following method.

The first method is a method of coating the underlayer with the interlayer containing the polymer compound 2 after the underlayer containing the polymer compound 1 is formed.

The second method is a method of applying a coating solution composition for forming an underlayer and an interlayer which contains the polymer compound 1 and the polymer compound 2 to form the underlayer and the interlayer through phase separation.

The details for forming the interlayer are described below in the method of producing a lithographic printing plate precursor.

The interlayer may contain one or two or more kinds of polymer compounds 2.

The content of the polymer compound 2 in the interlayer is preferably in a range of 20% by mass to 100% by mass, more preferably in a range of 50% by mass to 100% by mass, and still more preferably in a range of 75% by mass to 100% by mass with respect to the total mass of the underlayer.

Further, it is preferable that the interlayer does not contain other polymer compounds such as the polymer compound 1 and the polymer compound 3.

<Upper Layer>

The positive type lithographic printing plate precursor according to the embodiment of the present disclosure includes an upper layer containing the polymer compound 3 which is insoluble in water and soluble in an alkali aqueous solution and has a phenolic hydroxy group.

Further, it is preferable that the upper layer in the lithographic printing plate precursor according to the embodiment of the present disclosure is a layer whose solubility in an alkali aqueous solution is improved by heat.

Further, as the polymer compound 3 used for the upper layer, an alkali-soluble resin having a hydrogen-bonding capacity which is water-insoluble and alkali-soluble and whose solubility in an alkali aqueous solution is improved by heat, such as a novolac phenol resin, a phenolic hydroxy group-containing acetal resin, or a urethane resin can be used.

Further, the polymer compound 3 may be a polymer which is the same as the polymer compound 1, but it is preferable that the polymer compound 3 is different from the polymer compound 1.

Further, it is preferable that the upper layer further contains a compound having a dissolution suppressing action.

In addition, by further adding an infrared absorbent to the upper layer, the heat generated from the upper layer can also be used in image formation. Preferable examples of the constitution of the upper layer including an infrared absorbent include a layer including an infrared absorbent, a water-insoluble and alkali-soluble resin, and a compound having a dissolution suppressing action, and a layer including an infrared absorbent, a water-insoluble and alkali-soluble resin, and an acid generator.

<<Phenol Resin>>

As the polymer compound 3, a phenol resin having a constitutional unit derived from phenol or substituted phenols is preferably exemplified, and a novolac resin is more preferably exemplified.

A novolac resin is an alkali-soluble resin preferably used for the image recording layer according to the present disclosure from the viewpoint that strong hydrogen bonding properties are generated in an unexposed portion and some hydrogen bonds in an exposed portion are easily released.

The novolac resin is not particularly limited as long as the novolac resin contains a constitutional unit derived from phenols as a constitutional unit in a molecule.

The novolac resin in the present disclosure is a resin obtained by a condensation reaction between phenol or substituted phenols and aldehydes described below.

Specific examples of the phenols include phenol, isopropylphenol, t-butylphenol, t-amylphenol, hexylphenol, cyclohexylphenol, 3-methyl-4-chloro-6-t-butylphenol, isopropyl cresol, t-butyl cresol, and t-amyl cresol. Among these, t-butylphenol and t-butyl cresol are preferable.

Further, examples of the aldehydes include aliphatic and aromatic aldehydes such as formaldehyde, acetaldehyde, acrolein, and crotonaldehyde. Among these, formaldehyde and acetaldehyde are preferable.

More specifically, examples of the novolac resin of the present disclosure include a polycondensate of phenol and formaldehyde (phenol formaldehyde resin), a polycondensate of m-cresol and formaldehyde (m-cresol formaldehyde resin), a polycondensate of p-cresol and formaldehyde (p-cresol formaldehyde resin), a polycondensate of m-/p-mixed cresol and formaldehyde (m-/p-mixed cresol formaldehyde resin), a polycondensate (phenol/cresol (any mixture of m-, p-, or m-/p-) mixed formaldehyde resin) of phenol and cresol (any mixture of m-, p-, or m-/p-) and formaldehyde.

In addition, examples of the novolac resin include a polycondensate of phenol having an alkyl group having 3 to 8 carbon atoms as a substituent and formaldehyde, such as a t-butyl phenol formaldehyde resin or an octyl phenol formaldehyde resin, as described in U.S. Pat. No. 4,123,279A.

Among these novolac resins, a phenol formaldehyde resin, a phenol/cresol-mixed formaldehyde resin, and the like are particularly preferable.

The weight-average molecular weight of the novolac resin is preferably in a range of 500 to 50000, more preferably in a range of 700 to 20000, and particularly preferably in a range of 1000 to 10000. Further, the dispersity (weight-average molecular weight/number average molecular weight) is preferably in a range of 1.1 to 10.

These novolac resins may be used alone or in the form of a mixture of two or more kinds thereof.

From the viewpoints of the burning suitability and the image formability, the amount of the novolac resin to be added in the upper layer of the present disclosure is preferably in a range of 1% by mass to 90% by mass, more preferably in a range of 5% by mass to 50% by mass, and particularly preferably in a range of 10% by mass to 30% by mass with respect to the total mass of the upper layer.

Further, as the phenolic hydroxy group-containing acetal resin, the polymer compound having an acetal structure in the main chain, which is described in the section of the polymer compound 1, can also be used.

Further, in the upper layer according to the present disclosure, other resins that do not contain a phenolic hydroxy group can be used in combination within a range not impairing the effects of the present disclosure. Since the upper layer is required to express alkali-solubility, in particular, in a non-image area region, it is necessary to select a resin which does not impair this characteristic. From this viewpoint, as a resin usable in combination, a water-insoluble and alkali-soluble resin that does not contain a phenolic hydroxy group is exemplified. General water-insoluble and alkali-soluble resin will be described below in detail, and among these, a polyamide resin, an epoxy resin, a polyacetal resin, an acrylic resin, and a polystyrene-based resin, are preferably exemplified.

In addition, the amount to be mixed is preferably 50% by mass or less with respect to the water-insoluble and alkali-soluble resin.

The water-insoluble and alkali-soluble resin that does not contain a phenolic hydroxy group preferably has a weight-average molecular weight of 2,000 or greater and a number average molecular weight of 500 or greater, and more preferably has a weight-average molecular weight of 5,000 to 300,000 and a number average molecular weight of 800 to 250,000. The dispersity (weight-average molecular weight/number average molecular weight) of the alkali-soluble resin is preferably 1.1 to 10.

The alkali-soluble resin may be used alone or in combination of two or more kinds thereof.

The content of the polymer compound 3 in the upper layer is preferably in a range of 2.0% by mass to 99.5% by mass, more preferably in a range of 10.0% by mass to 99.0% by mass, and still more preferably in a range of 20.0% by mass to 90.0% by mass with respect to the total mass of the upper layer. In a case where the content of the polymer compound 3 is 2.0% by mass or greater, the durability of the upper layer is excellent. Further, in a case where the content thereof is 99.5% by mass or less, both of the sensitivity and the durability are excellent.

<Infrared Absorbent>

The positive type lithographic printing plate precursor according to the embodiment of the present disclosure contains an infrared absorbent in one or more layers from among the underlayer, the interlayer, and the upper layer.

The infrared absorbent is not particularly limited as long as it is a dye which generates heat by absorbing infrared light, and various dyes known as an infrared absorbent can be used.

Further, as the infrared absorbent, an infrared absorbent having the maximum absorption wavelength at a wavelength of 750 nm to 1400 nm is preferable.

As the infrared absorbent which can be used in the present disclosure, commercially available dyes or known dyes described in documents (for example, "Dye Handbook", compiled by the Society of Synthetic Organic Chemistry, published in 1970) can be used. Specifically, dyes such as azo dyes, metal complex salt azo dyes, pyrazolone azo dyes, anthraquinone dyes, phthalocyanine dyes, carbonium dyes, quinone imine dyes, methine dyes, and cyanine dyes are exemplified. In the present disclosure, among these dyes, a dye absorbing at least infrared light or near infrared light is preferable from the viewpoint of being suitable for use in laser emitting infrared light or near infrared light, and a cyanine dye is particularly preferable.

Examples of such a dye absorbing at least infrared light or near infrared light include the cyanine dyes described in JP1983-125246A (JP-S58-125246A), JP1984-084356A (JP-S59-084356A), JP-1984-202829A (JP-S59-202829A), or JP1985-078787A (JP-S60-078787A), the methine dyes described in JP1983-173696A (JP-S58-173696A), JP1983-181690A (JP-S58-181690A), or JP1983-194595A (JP-S58-194595A), the naphthoquinone dyes described in JP1983-112793A (JP-S58-112793A), JP1983-224793A (JP-S58-224793A), JP1984-048187A (JP-S59-048187A), JP1984-073996A (JP-S59-073996A), JP1985-052940A (JP-S60-052940A), or JP1985-063744A (JP-S60-063744A), the squarylium coloring agents described in JP1983-112792A (JP-S58-112792A), and the cyanine dyes described in GB434875B.

In addition, as the dye, the near infrared absorbing sensitizers described in U.S. Pat. No. 5,156,938A are also suitably used, also, the substituted aryl benzo(thio)pyrylium salts described in U.S. Pat. No. 3,881,924A, the trimethine-cyanine thiapyrylium salts described in JP1982-142645A (JP-S57-142645A) (U.S. Pat. No. 4,327,169A), the pyrylium-based compounds described in JP1983-181051A (JP-S58-181051A), JP1983-220143A (JP-S58-220143A), JP1984-041363A (JP-S59-041363A), JP1984-084248A (JP-S59-084248A), JP1984-084249A (JP-S59-084249A), JP1984-146063A (JP-S59-146063A), or JP1984-146061A (JP-S59-146061A), the cyanine coloring agents described in JP1984-216146A (JP-S59-216146A), the pentamethinethiopyrylium salts described in U.S. Pat. No. 4,283,475A, or the pyrylium compounds described in JP1993-013514B (JP-H05-013514B) or JP1993-019702B (JP-H05-019702B) are used, and as commercially available products, Epolight III-178, Epolight III-130, Epolight III-125, or the like (manufactured by Epolin Inc.) is particularly preferably used.

In addition, particularly preferable another examples of the dye include near infrared absorbing dyes described as Formula (I) or (II) in U.S. Pat. No. 4,756,993A.

Among these dyes, examples of a particularly preferable dye include a cyanine coloring agent, a phthalocyanine dye, an oxonol dye, a squarylium coloring agent, a pyrylium salt, a thiopyrylium dye, and a nickel thiolate complex. Furthermore, in a case where a cyanine coloring agent represented by the following Formula (a) is used in the upper layer in the present disclosure, a high polymerization activity is imparted and the stability and the economic efficiency become excellent, and thus, the cyanine coloring agent is most preferable.

Formula (a)

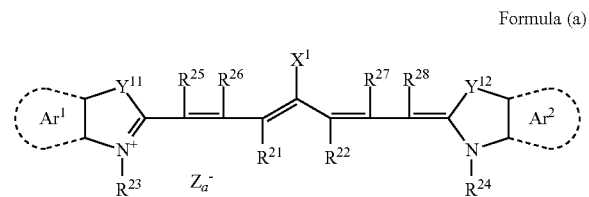

In Formula a, $X^1$ represents a hydrogen atom, a halogen atom, a diarylamino group (—$NPh_2$), $X^2$-$L^2$, or a group shown below. $X^2$ represents an oxygen atom or a sulfur atom. $L^2$ represents a hydrocarbon group having 1 to 12 carbon atoms, an aromatic ring having a heteroatom, or a hydrocarbon group having 1 to 12 carbon atoms including a heteroatom. Here, the heteroatom represents N, S, O, a halogen atom, or Se.

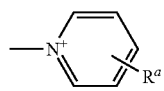

In the formula, $Xa^-$ has the same definition as $Za^-$ described below, and $R^a$ represents a substituent selected from a hydrogen atom, an alkyl group, an aryl group, a substituted or unsubstituted amino group, and a halogen atom. $R^{21}$ and $R^{22}$ each independently represent a hydrocarbon group having 1 to 12 carbon atoms. From the viewpoint of storage stability of the coating solution, it is preferable that $R^{21}$ and $R^{22}$ represent a hydrocarbon group having 2 to 12 carbon atoms and particularly preferable that $R^{21}$ and $R^{22}$ are bonded to each other to form a 5-membered ring or a 6-membered ring.

$Ar^1$ and $Ar^2$ may be the same as or different from each other, and $Ar^1$ and $Ar^2$ each represent an aromatic hydrocarbon group which may have a substituent. Examples of a preferable aromatic hydrocarbon group include a benzene ring and a naphthalene ring. In addition, examples of a preferable substituent include a hydrocarbon group having 1 to 12 carbon atoms, a halogen atom, and an alkoxy group having 1 to 12 carbon atoms.

$Y^{11}$ and $Y^{12}$ may be the same as or different from each other, and $Y^{11}$ and $Y^{12}$ each represent a sulfur atom or a dialkyl methylene group having 3 to 12 carbon atoms. $R^{23}$ and $R^{24}$ may be the same as or different from each other, and $R^{23}$ and $R^{24}$ each represent a hydrocarbon group having 1 to 20 carbon atoms which may have a substituent. Examples of a preferable substituent include an alkoxy group having 1 to 12 carbon atoms, a carboxyl group, and a sulfo group.

$R^{25}$, $R^{26}$, $R^{27}$, and $R^{28}$ may be the same as or different from each other, and $R^{25}$, $R^{26}$, $R^{27}$, and $R^{28}$ each represent a hydrogen atom or a hydrocarbon group having 1 to 12 carbon atoms. From the viewpoint of availability of a raw material, each of $R^{25}$, $R^{26}$, $R^{27}$, and $R^{28}$ is preferably a hydrogen atom. In addition, $Za^-$ represents a counter anion. Here, the cyanine coloring agent represented by Formula (a) has an anionic substituent in the structure thereof, and in a case where neutralization of the charge is not necessary, $Za^-$ is not necessary. From the viewpoint of storage stability of the photosensitive resin composition, $Za^-$ is preferably a halide ion, a perchlorate ion, a tetrafluoroborate ion, a hexafluorophosphate ion, or a sulfonic acid ion, and particularly preferably a perchlorate ion, a hexafluorophosphate ion, or an arenesulfonic acid ion.

Specific examples of the cyanine coloring agent represented by Formula (a) which can be suitably used include the cyanine coloring agents described in paragraphs 0017 to 0019 of JP2001-133969A, paragraphs 0012 to 0038 of JP2002-040638A, and paragraphs 0012 to 0023 of JP2002-023360A.

The infrared absorbent contained in the upper layer is particularly preferably a cyanine dye A shown below.

Cyanine dye A

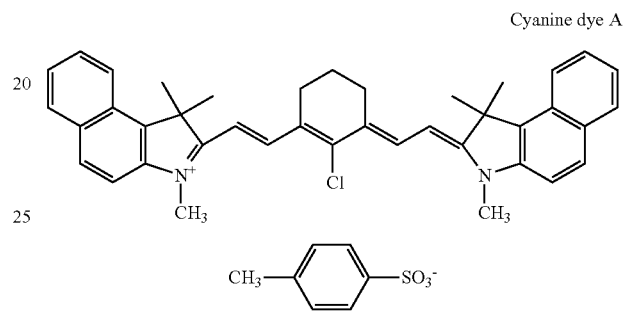

The content of the infrared absorbent is preferably in a range of 0.01% by mass to 50% by mass, more preferably 0.1% by mass to 30% by mass, and particularly preferably 1.0% by mass to 30% by mass with respect to the total mass of the underlayer, the interlayer, and the upper layer. In a case where the content thereof is 0.01% by mass or greater, the layer becomes highly sensitive, and in a case where the content thereof is 50% by mass or less, the uniformity of the layers is excellent and the durability of the layers is also excellent.

Further, it is preferable that the lithographic printing plate precursor according to the embodiment of the present disclosure contains an infrared absorbent in the upper layer. In a case where the upper layer contains an infrared absorbent, the sensitivity becomes excellent.

The amount of the infrared absorbent to be added in the upper layer is preferably in a range of 0.01% to 50% by mass, more preferably 0.1% to 30% by mass, and particularly preferably 1.0% to 10% by mass with respect to the total mass of the upper layer. In a case where the amount of the infrared absorbent to be added is 0.01% by mass or greater, the layer becomes highly sensitive, and in a case where the amount of the infrared absorbent to be added is 50% by mass or less, the uniformity of the layers is excellent and the durability of the layers is also excellent.

The underlayer, the interlayer, and the upper layer of the present disclosure may contain other components as desired within the range not damaging the effects of the present disclosure.

Hereinafter, other alkali-soluble resins, acid generators, acid proliferation agents, and other additives, which are other components, will be described.

<Acid Generator>

From the viewpoint of improving the sensitivity, it is preferable that at least one of the underlayer, the interlayer, or the upper layer of the present disclosure contains an acid generator.

The acid generator in the present disclosure is a compound which generates an acid by light or heat, and indicates a compound which generates an acid due to decomposition by irradiation with infrared rays or heating at 100° C. or higher. The acid generated is preferably a strong acid having a pKa of 2 or less such as sulfonic acid or hydrochloric acid. The acid generated from this acid generator functions as a catalyst, a chemical bond in the acid decomposable group is cleaved so that an acid group is formed, and thus the solubility of the image recording layer in an alkali aqueous solution is further improved due to an acid generated from this acid generator.

Examples of the acid generator suitably used in the present disclosure include onium salts such as an iodonium salt, a sulfonium salt, a phosphonium salt, and a diazonium salt. Specifically, the compounds described in U.S. Pat. No. 4,708,925A or JP1995-020629A (JP-H07-020629A) can be exemplified. In particular, an iodonium salt, a sulfonium salt, or a diazonium salt, which has a sulfonic acid ion as a counter ion, is preferable. As the diazonium salt, the diazonium compound described in U.S. Pat. No. 3,867,147A, the diazonium compound described in U.S. Pat. No. 2,632,703A, or the diazo resins described in JP1989-102456A (JP-H01-102456A) or JP1989-102457A (JP-H01-102457A) are also preferable. In addition, the benzyl sulfonates described in U.S. Pat. No. 5,135,838A or U.S. Pat. No. 5,200,544A are also preferable. Furthermore, the active sulfonic acid esters or the disulfonyl compounds described in JP1990-100054A (JP-H02-100054A), JP1990-100055A (JP-H02-100055A), or JP1997-197671A (JP-H09-197671) are also preferable. In addition, the haloalkyl-substituted S-triazines described in JP1995-271029A (JP-H07-271029A) are also preferable.

Furthermore, the compound described as an "acid precursor" in JP1996-220752A (JP-H08-220752A) or the compound described as "(a) a compound which can generate an acid by irradiation with active light" in JP1997-171254A (JP-H09-171254A) can also be applied as the acid generator of the present disclosure.

Among these, from the viewpoint of sensitivity and stability, an onium salt compound is preferably used as an acid generator. The onium salt compound will be described below.

As the onium salt compound which can be suitably used in the present disclosure, compounds known as a compound which generates an acid due to decomposition by infrared ray exposure or heat energy generated from the infrared absorbent by exposure can be exemplified. As the onium salt compound suitable in the present disclosure, from the viewpoint of sensitivity, known thermal polymerization initiators or compounds having a bond with small bond dissociation energy and having an onium salt structure described below can be exemplified.

Examples of the onium salt suitably used in the present disclosure include known diazonium salts, iodonium salts, sulfonium salts, ammonium salts, pyridinium salts, and azinium salts, and among these, sulfonate of triarylsulfonium or diaryliodonium, carboxylate, $BF_4^-$, $PF_6^-$, or $ClO_4^-$ is preferable.

Examples of the onium salt which can be used as an acid generator in the present disclosure include onium salts represented by the following Formulae (III) to (V).

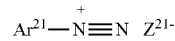

Formula (III)

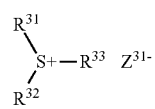

Formula (IV)

Formula (V)

In Formula III, $Ar^{11}$ and $Ar^{12}$ each independently represent an aryl group having 6 to 20 carbon atoms which may have a substituent. Examples of a preferable substituent in a case where the aryl group has a substituent include a halogen atom, a nitro group, an alkyl group having 1 to 12 carbon atoms, an alkoxy group having 1 to 12 carbon atoms, and an aryloxy group having 1 to 12 carbon atoms. $Z^{11-}$ represents a counter ion selected from the group consisting of a halogen ion, a perchlorate ion, a tetrafluoroborate ion, a hexafluorophosphate ion, a sulfonic acid ion, or a sulfonic acid ion having a fluorine atom such as a perfluoroalkyl sulfonic acid ion, and a perchlorate ion, a hexafluorophosphate ion, an aryl sulfonic acid ion, or a perfluoroalkyl sulfonic acid is preferable.

In Formula IV, $Ar^{21}$ represents an aryl group having 6 to 20 carbon atoms which may have a substituent. Examples of a preferable substituent include a halogen atom, a nitro group, an alkyl group having 1 to 12 carbon atoms, an alkoxy group having 1 to 12 carbon atoms, an aryloxy group having 6 to 12 carbon atoms, an alkylamino group having 1 to 12 carbon atoms, a dialkylamino group having 2 to 12 carbon atoms, an arylamino group having 6 to 12 carbon atoms, and a diarylamino group having 12 to 20 carbon atoms. $Z^{21-}$ represents a counter ion having the same meaning as $Z^{11-}$.

In Formula V, $R^{31}$, $R^{32}$, and $R^{33}$ may be the same as or different from each other, and $R^{31}$, $R^{32}$, and $R^{33}$ each represent a hydrocarbon group having 1 to 20 carbon atoms which may have a substituent. Examples of a preferable substituent include a halogen atom, a nitro group, an alkyl group having 1 to 12 carbon atoms, an alkoxy group having 1 to 12 carbon atoms, and an aryloxy group having 6 to 12 carbon atoms. $Z^{31-}$ represents a counter ion having the same meaning as $Z^{11-}$.

In the present disclosure, specific examples of onium salts (OI-1 to OI-10) represented by Formula III, onium salts (ON-1 to ON-5) represented by Formula IV, and onium salts (OS-1 to OS-6) represented by Formula V which can be suitably used in the present invention are exemplified below.

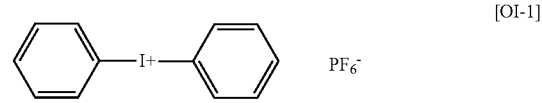

[OI-1]

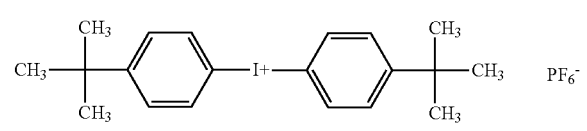

[OI-2]

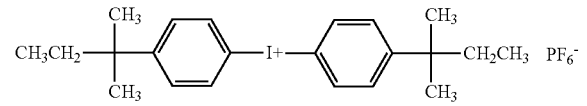

[OI-3]

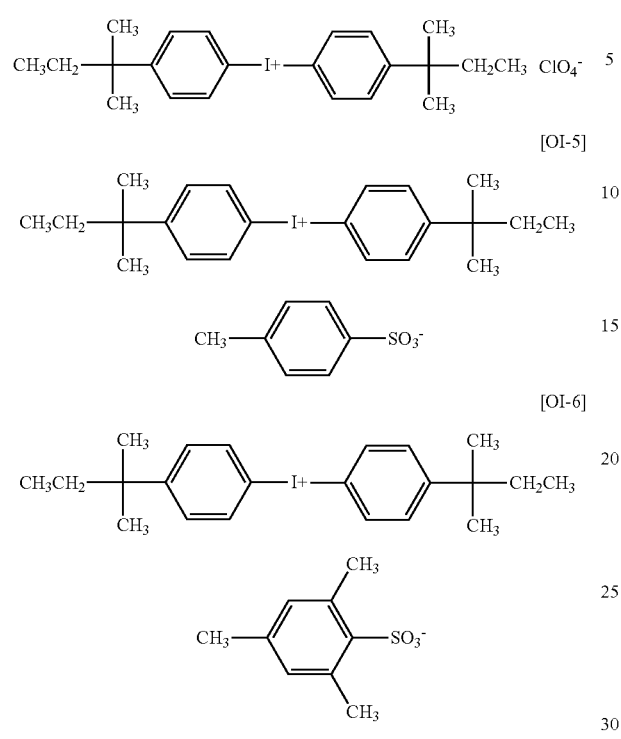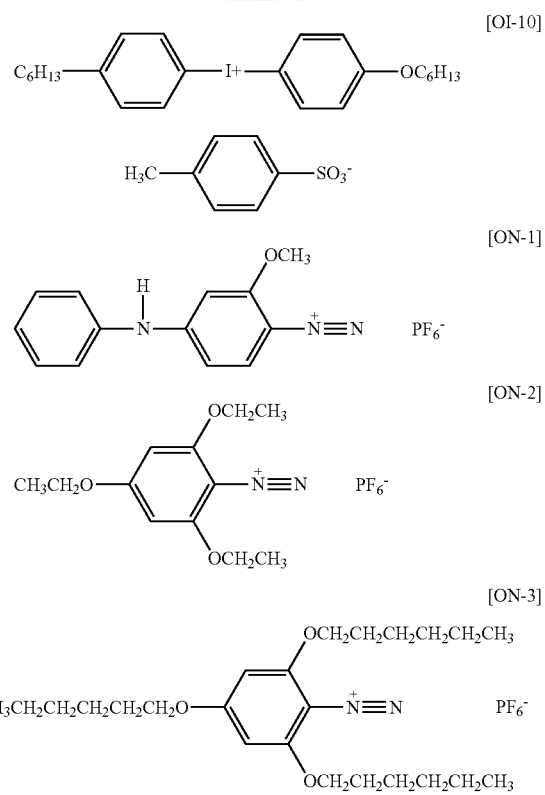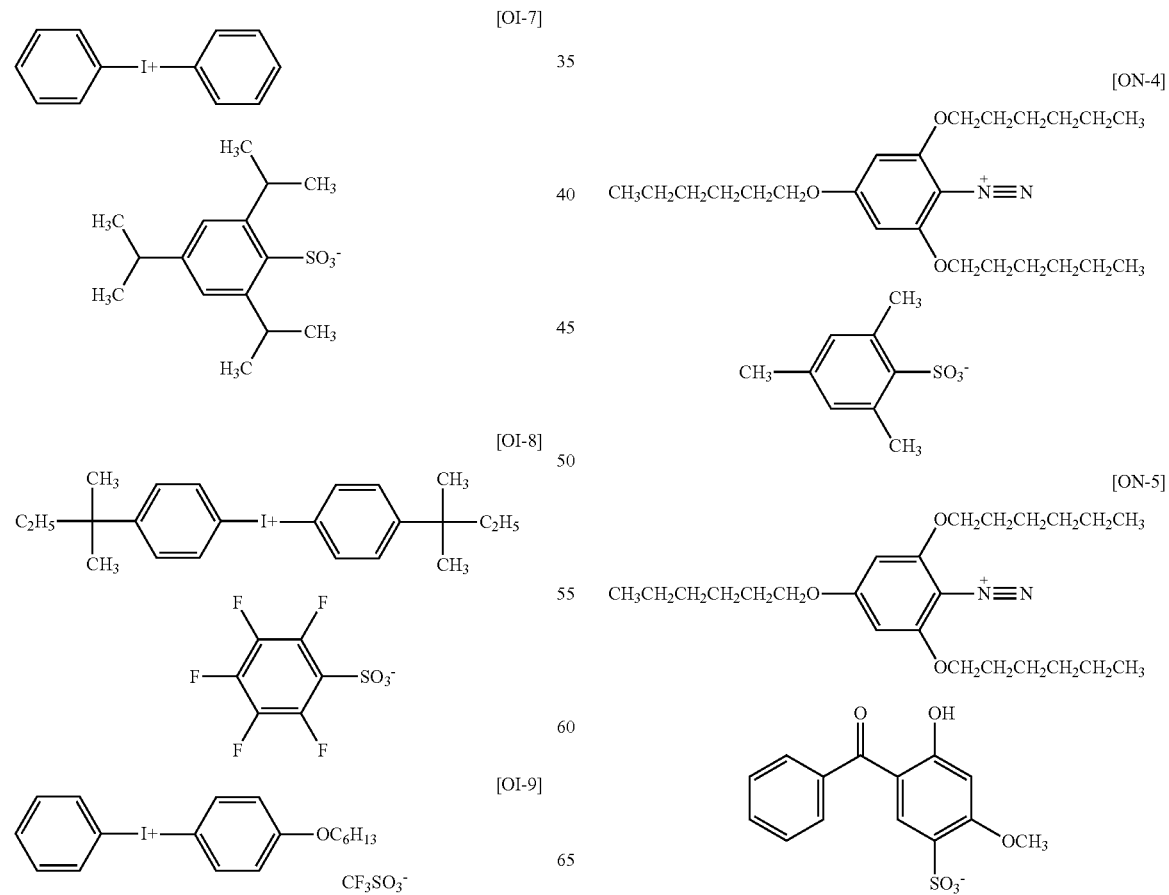

[OS-1]
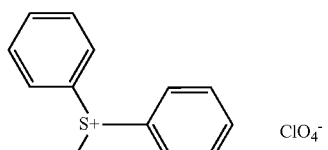 ClO$_4^-$

[OS-2]
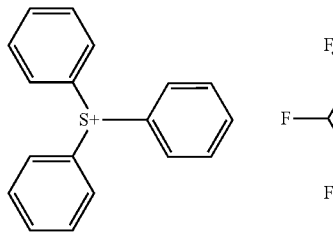 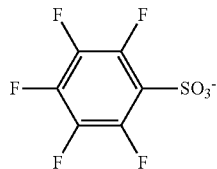

[OS-3]
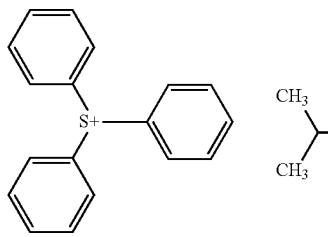 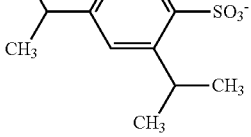

[OS-4]
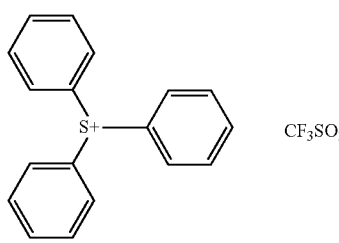 CF$_3$SO$_3^-$

[OS-5]
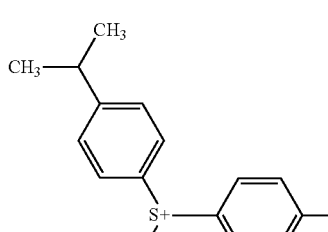 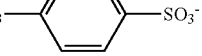

[OS-6]
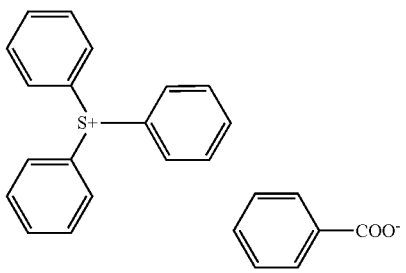

In addition, as another example of the compounds represented by each of Formulae III to V, the compounds described as an example of a radical polymerization initiator in paragraphs 0036 to 0045 of JP2008-195018A can be suitably used as an acid generator in the present disclosure.

Another example of a preferable onium salt as the acid generator used in the present disclosure includes an azinium salt compound represented by the following Formula VI.

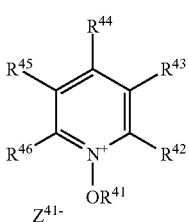

Formula (VI)

In Formula VI, $R^{41}$, $R^{42}$, $R^{43}$, $R^{44}$, $R^{45}$, and $R^{46}$ may be the same as or different from each other, and $R^{41}$, $R^{42}$, $R^{43}$, $R^{44}$, $R^{45}$, and $R^{46}$ each represent a hydrogen atom, a halogen atom, or a monovalent substituent.

Examples of the monovalent substituent include a halogen atom, an amino group, a substituted amino group, a substituted carbonyl group, a hydroxyl group, a substituted oxy group, a thiol group, a thioether group, a silyl group, a nitro group, a cyano group, an alkyl group, an alkenyl group, an aryl group, a heterocyclic group, a sulfo group, a substituted sulfonyl group, a sulfonate group, a substituted sulfinyl group, a phosphono group, a substituted phosphono group, a phosphonate group, and a substituted phosphonate group, and in the case of being introducible, each of $R^{41}$, $R^{42}$, $R^{43}$, $R^{44}$, $R^{45}$, and $R^{46}$ may further have a substituent.

A compound (multimerized form) including two or more cation portions in the molecule as a result of bonding of the skeletons (cation portions) having a specific structure in the compound represented by Formula VI to each other through $R^{41}$ is also included in examples of the compound represented by Formula VI, and such a compound is also suitably used.

$Z^{41-}$ represents a counter ion having the same meaning as $Z^{11-}$.

Specific examples of the azinium salt compound represented by Formula VI include the compounds described in paragraphs 0047 to 0056 of JP2008-195018A.

In addition, a compound group having an N—O bond described in JP1988-138345A (JP-S63-138345A), JP1988-142345A (JP-S63-142345A), JP1988-142346A (JP-S63-142346A), JP1988-143537A (JP-S63-143537A), or JP1971-042363B (JP-S46-042363B) is also suitably used as the acid generator in the present disclosure.

More preferable examples of the acid generator which can be used in the present disclosure include the following compounds (PAG-1) to (PAG-5). Me represents a methyl group.

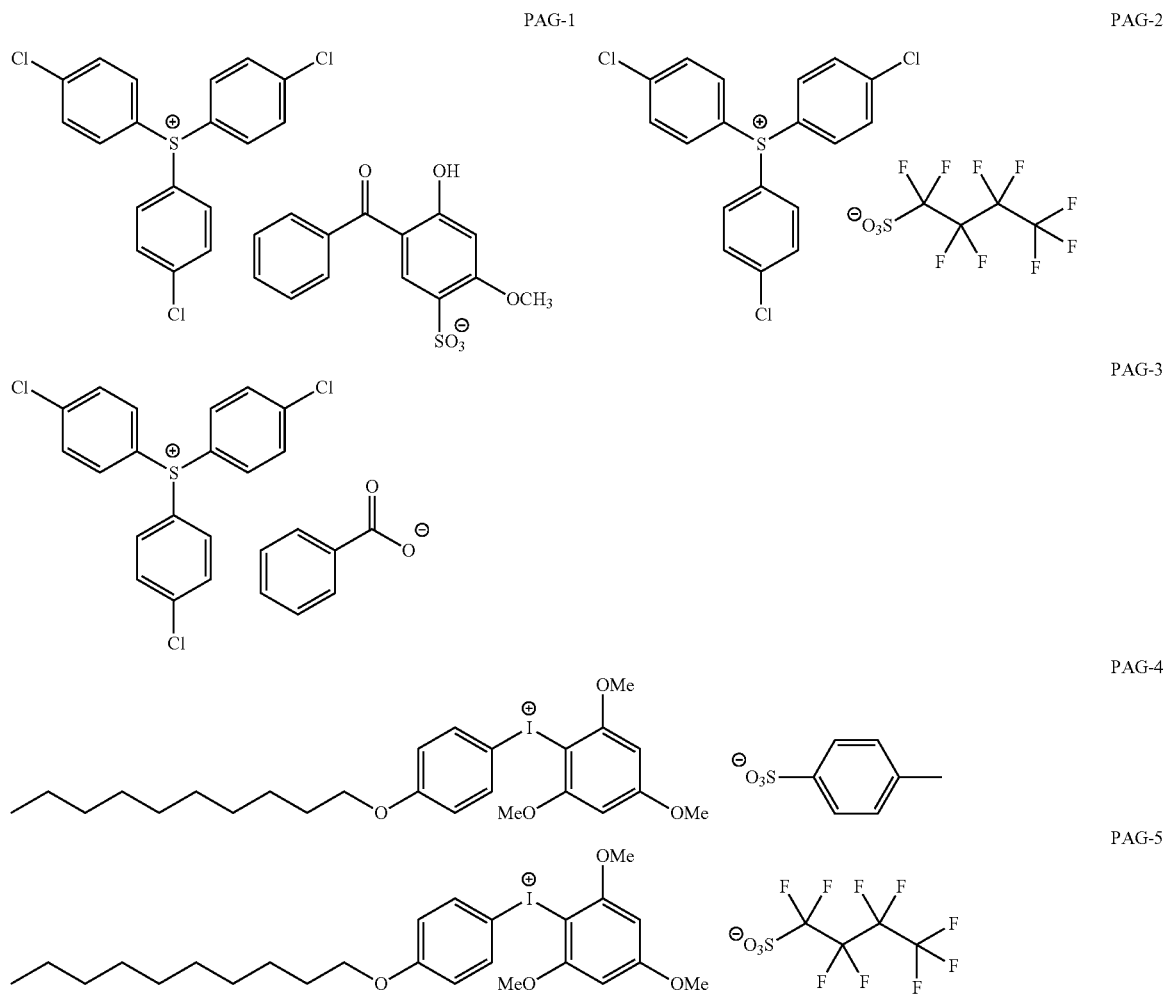

The acid generator may be used alone or in combination of two or more types thereof.

The amount of the acid generator to be added is preferably in a range of 0.01% by mass to 50% by mass, more preferably in a range of 0.1% by mass to 40% by mass, and still more preferably in a range of 0.5% by mass to 30% by mass with respect to the total mass of the layer to be added. In a case where the amount of the acid generator to be added is in the above-described range, improvement of the sensitivity which is the effect of adding the acid generator is observed, and occurrence of a residual film in a non-image area is suppressed.

<Acid Proliferation Agent>

An acid proliferation agent may be added to at least one layer of the underlayer, the interlayer, or the upper layer and preferably the upper layer in the present disclosure.

The acid proliferation agent in the present disclosure is a compound substituted with a residue of a relatively strong acid, and a compound which newly generates an acid by being easily released in the presence of an acid catalyst. That is, the compound is decomposed by an acid catalyzed reaction, and generates an acid (hereinafter, referred to as ZOH in formulae) again. Since one or more acids per reaction are increased, and with the progress of the reaction, the acid concentration is increasingly increased, sensitivity is dramatically improved. The intensity of this generated acid is 3 or less as an acid dissociation constant (pKa), and preferably 2 or less. In the case of a weaker acid than this, it is not possible to cause the elimination reaction by an acid catalyst.

Examples of the acid used in such an acid catalyst include dichloroacetic acid, trichloroacetic acid, methanesulfonic acid, ethanesulfonic acid, benzenesulfonic acid, p-toluenesulfonic acid, naphthalenesulfonic acid, and phenyl sulfonic acid.

As the acid proliferation agent, the acid proliferation agents described in WO95/29968A, WO98/24000A, JP1996-305262A (JP-H08-305262A), JP1997-034106A (JP-H09-034106A), JP1996-248561A (JP-H08-248561A), JP1996-503082A (JP-H08-503082A), U.S. Pat. No. 5,445,917A, JP1996-503081A (JP-H08-503081A), U.S. Pat. Nos. 5,534,393A, 5,395,736A, 5,741,630A, 5,334,489A, 5,582,956A, 5,578,424A, 5,453,345A, 5,445,917A, EP665960B, EP757628B, EP665961B, U.S. Pat. No. 5,667,943A, or JP1998-001598A (JP-H10-001598A) can be used alone or in combination of two or more types thereof.

Specific preferred examples of the acid proliferation agent in the present disclosure include the compounds described in paragraphs 0056 to 0067 of JP2001-066765A. Among these, the following compounds described as an exemplary compound (ADD-1), (ADD-2), or (ADD-3) can be suitably used.

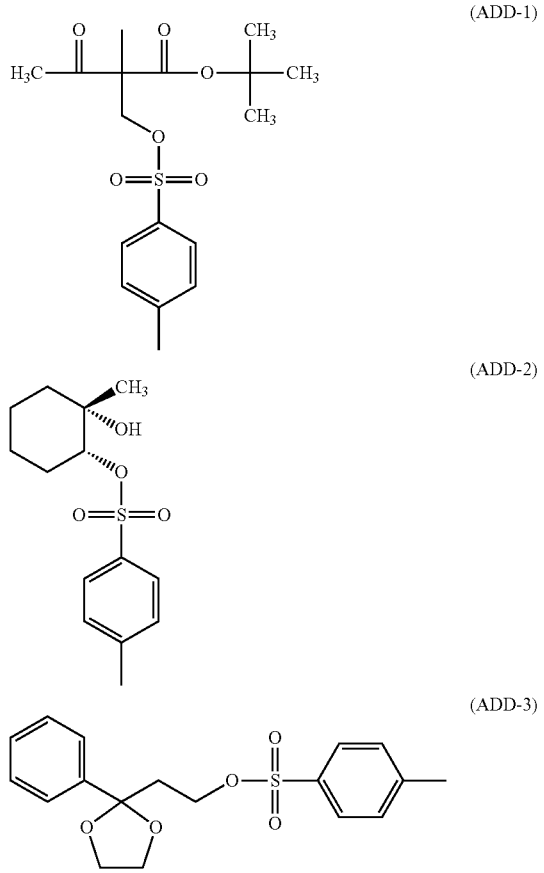

In a case where the acid proliferation agent is added to at least one of the underlayer, the interlayer, or the upper layer and preferably the upper layer, the amount of the acid proliferation agent to be added is preferably in a range of 0.01% by mass to 20% by mass, more preferably in a range of 0.01% by mass to 10% by mass, and still more preferably in a range of 0.1% by mass to 5% by mass with respect to the total mass of the layers to which the acid proliferation agent has been added. In a case where the amount of the acid proliferation agent to be added is in the above-described range, effects of adding the acid proliferation agent are sufficiently obtained, improvement of the sensitivity is achieved, and degradation of the film hardness of an image area is suppressed.

<Other Additives>

At least one of the underlayer, the interlayer, or the upper layer of the present disclosure may contain a development accelerator, a surfactant, a print-out agent/colorant, a plasticizer, or a wax agent, as other additives.

—Development Accelerator—

For the purpose of improving sensitivity, a compound selected from the group consisting of acid anhydrides, phenols, and organic acids may be added to at least one of the underlayer, the interlayer, or the upper layer of the present disclosure.

As the acid anhydrides, cyclic acid anhydride is preferable, and specifically, as the cyclic acid anhydride, phthalic acid anhydride, tetrahydrophthalic acid anhydride, hexahydrophthalic acid anhydride, 3,6-endooxytetrahydrophthalic acid anhydride, tetrachlorophthalic acid anhydride, maleic acid anhydride, chloromaleic acid anhydride, α-phenylmaleic acid anhydride, succinic acid anhydride, or pyromellitic acid anhydride described in U.S. Pat. No. 4,115,128A can be used. As the non-cyclic acid anhydride, acetic acid anhydride is exemplified.

Examples of the phenols include bisphenol A, 2,2'-bishydroxysulfone, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenyl methane, and 4,4',3",4"-tetrahydroxy-3,5,3',5'-tetramethyltriphenyl methane.

The organic acids are described in JP1985-088942A (JP-S60-088942A), JP1990-096755A (JP-H02-096755A), or the like, and specific examples thereof include p-toluenesulfonic acid, dodecylbenzenesulfonic acid, p-toluenesulfinic acid, ethyl sulfate, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid, and ascorbic acid.

The proportion of the acid anhydrides, the phenols, and the organic acids is preferably in a range of 0.05% by mass to 20% by mass, more preferably in a range of 0.1% by mass to 15% by mass, and particularly preferably in a range of 0.1% by mass to 10% by mass with respect to the total mass of the layers to which the acid anhydrides, the phenols, and the organic acid have been added.

—Surfactant—

To improve coating properties and stability of a treatment with respect to development conditions, a nonionic surfactant as described in JP1987-251740A (JP-S62-251740A) or JP1991-208514A (JP-H03-208514A), an amphoteric surfactant as described in JP1984-121044A (JP-S59-121044A) or JP1992-013149A (JP-H04-013149A), or a fluorine-containing monomer copolymer such as JP1987-170950A (JP-S62-170950A), JP1999-288093A (JP-H11-288093A), or JP2003-057820A can be added to at least one of the underlayer, the interlayer, or the upper layer of the present disclosure.

Specific examples of the nonionic surfactant include sorbitan tristearate, sorbitan monopalmitate, sorbitan trioleate, monoglyceride stearate, and polyoxyethylenenonylphenyl ether.

Specific examples of the amphoteric surfactant include alkyl di(aminoethyl)glycine, alkylpolyaminoethylglycine hydrochloride, 2-alkyl-N-carboxyethyl-N-hydroxyethyl imidazolinium betaine, and an N-tetradecyl-N,N-betaine type (for example, trade name "AMOGEN K", manufactured by Dai-ichi Kogyo Seiyaku Co., Ltd.).

The proportion of the surfactant in the layers to which the surfactant has been added is preferably in a range of 0.01% by mass to 15% by mass, more preferably in a range of 0.01% by mass to 5% by mass, and still more preferably in a range of 0.05% by mass to 2.0% by mass.

—Print-out Agent/Colorant—

A print-out agent for obtaining a visible image immediately after heating by exposure or a dye or a pigment as an image colorant can be added to at least one of the underlayer, the interlayer, or the upper layer of the present disclosure.

Examples of the print-out agent and the colorant are described in detail in paragraphs 0122 and 0123 of JP2009-229917A, and the compounds described here can be applied to the present disclosure.

The dyes are added in proportion of preferably 0.01% by mass to 10% by mass and more preferably in a range of 0.1% by mass to 3% by mass with respect to the total mass of the layers to which the dyes have been added.

—Plasticizer—

To impart flexibility or the like to the coating film, a plasticizer may be added to at least one of the underlayer, the interlayer, or the upper layer of the present disclosure. For example, butylphthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, or an oligomer or a polymer of acrylic acid or methacrylic acid is used.

These plasticizers are preferably added in a proportion of 0.5% by mass to 10% by mass and more preferably added in a proportion of 1.0% by mass to 5% by mass with respect to the total mass of the layer to which the plasticizers have been added.

—Wax Agent—

For the purpose of imparting resistance against scratches, a compound for reducing the coefficient of static friction of the surface can also be added to at least one of the underlayer, the interlayer, or the upper layer of the present disclosure. Specifically, the compounds having an ester of a long chain alkyl carboxylic acid as described in U.S. Pat. No. 6,117,913A, JP2003-149799A, JP2003-302750A, or JP2004-012770A can be exemplified.

The amount of the wax agent to be added is preferably in a range of 0.1% by mass to 10% by mass and more preferably in a range of 0.5% by mass to 5% by mass with respect to the total mass of the layers to which the wax agent has been added.

<Compositional Ratio of Respective Components>

The total content of the polymer compounds 1, 2, and 3 is preferably in a range of 10% by mass to 90% by mass, the content of the infrared absorbent is preferably in a range of 0.01% by mass to 50% by mass, the content of the acid generator is preferably in a range of 0% by mass to 30% by mass, the content of the acid proliferation agent is preferably in a range of 0% by mass to 20% by mass, the content of the development accelerator is preferably in a range of 0% by mass to 20% by mass, the content of the surfactant is preferably in a range of 0% by mass to 5% by mass, the content of the print-out agent/colorant is preferably in a range of 0% by mass to 10% by mass, the content of the plasticizer is preferably in a range of 0% by mass to 10% by mass, and the content of the wax agent is preferably in a range of 0% by mass to 10% by mass, with respect to the total mass of the underlayer, the interlayer, and the upper layer in the lithographic printing plate precursor according to the embodiment of the present disclosure.

<Solvent>

The underlayer, the interlayer, and the upper layer in the lithographic printing plate precursor according to the embodiment of the present disclosure can be formed by dissolving respective components in a solvent and coating a suitable support with the solution.

Examples of the solvent used here include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethyl urea, N-methylpyrrolidone, dimethyl sulfoxide, sulfolane, γ-butyrolactone, toluene, and 1,3-dimethyl-2-imidazolidinone, and the present invention is not limited thereto. These solvents are used alone or in the form of a mixture.

The content of the polymer compound 1, 2, or 3 in the underlayer, the interlayer, and the upper layer is preferably in a range of 10% by mass to 100% by mass, more preferably in a range of 50% by mass to 98% by mass, and still more preferably in a range of 60% by mass to 95% by mass with respect to the total mass of the layers containing the polymer compound 1, 2, or 3. In a case where the content thereof is in the above-described range, the pattern formability during the development becomes excellent.

The total coating amount of the dried underlayer components and interlayer components to be applied onto the support of the lithographic printing plate precursor according to the embodiment of the present disclosure is preferably in a range of 0.5 $g/m^2$ to 4.0 $g/m^2$ and more preferably in a range of 0.6 $g/m^2$ to 2.5 $g/m^2$. In a case where the total coating amount thereof is 0.5 $g/m^2$ or greater, the printing durability is excellent. Further, in a case where the total coating amount thereof is 4.0 $g/m^2$ or less, the image reproducibility and the sensitivity are excellent.

Further, the coating amount of the dried upper layer components is preferably in a range of 0.05 $g/m^2$ to 1.0 $g/m^2$ and more preferably in a range of 0.08 $g/m^2$ to 0.7 $g/m^2$. In a case where the coating amount thereof is 0.05 $g/m^2$ or greater, the development latitude and the scratch resistance are excellent. Further, the coating amount thereof is 1.0 $g/m^2$ or less, the sensitivity is excellent.

The total coating amount of the dried underlayer, interlayer, and upper layer is preferably in a range of 0.6 $g/m^2$ to 4.0 $g/m^2$ and more preferably in a range of 0.7 $g/m^2$ to 2.5 $g/m^2$. In a case where the total coating amount thereof is 0.6 $g/m^2$ or greater, the printing durability is excellent. Further, in a case where the total coating amount thereof is 4.0 $g/m^2$ or less, the image reproducibility and the sensitivity are excellent.

<Support>

The support used in the present disclosure is not particularly limited as long as it is a dimensionally stable plate-shaped material having necessary strength and durability, and examples thereof include paper, paper on which plastic (for example, polyethylene, polypropylene, and polystyrene) has been laminated, a metal plate (for example, aluminum, zinc, and copper), a plastic film (for example, cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, and polyvinyl acetal), and paper or a plastic film on which the above-described metals have been laminated or vapor-deposited.

Moreover, as the support used for the lithographic printing plate precursor according to the embodiment of the present disclosure, a polyester film or an aluminum plate is preferable. Among these, the aluminum plate which has excellent dimensional stability and is relatively inexpensive is particularly preferable. A suitable aluminum plate is a pure aluminum plate or an alloy plate which has aluminum as the main component and includes a small amount of other elements, or may be a plastic film on which aluminum has been laminated or vapor-deposited. Examples of other elements included in the aluminum alloy include silicon, iron, manganese, copper, magnesium, chromium, zinc, bismuth, nickel, and titanium. The content of other elements in the alloy is preferably 10% by mass or less.

Although particularly suitable aluminum in the present disclosure is pure aluminum, it is difficult to produce completely pure aluminum on refining technique, and thus, other elements may be slightly contained.

The composition of the aluminum plate used in the present disclosure as described above is not particularly limited, and aluminum plates formed of known and used materials in the related art can be appropriately used. The thickness of the aluminum plate used in the present disclosure is preferably in a range of 0.1 mm to 0.6 mm, more preferably in a range of 0.15 mm to 0.4 mm, and particularly preferably in a range of 0.2 mm to 0.3 mm.

Such an aluminum plate may be subjected to a surface treatment such as a surface-roughening treatment and an anodization treatment, as necessary. As the surface treatment of the aluminum support, for example, a degreasing treatment with a surfactant, an organic solvent, or an alkali aqueous solution, a roughening treatment of a surface, an anodization treatment, or the like, as described in detail in paragraphs 0167 to 0169 of JP2009-175195A, is suitably performed.

The aluminum surface on which an anodization treatment has been performed may be subjected to a hydrophilizing treatment, as necessary.

As the hydrophilizing treatment, the alkali metal silicate (for example, sodium silicate aqueous solution) method, the method of treating with potassium fluoride zirconate or polyvinylphosphonic acid, or the like, as disclosed in paragraph 0169 of 2009-175195, is used.

In addition, the supports described in JP2011-245844A can also be preferably used.

<Undercoat Layer>

The lithographic printing plate precursor according to the embodiment of the present disclosure may be provided with an undercoat layer between the support and the underlayer as necessary. Further, the undercoat layer described below functions as a hydrophilic layer.

As the undercoat layer component, various organic compounds can be used, and preferable examples thereof include phosphonic acids having an amino group such as carboxymethyl cellulose or dextrin, an organic phosphonic acid, an organic phosphorus acid, an organic phosphinic acid, amino acids, and hydrochloride of an amine having a hydroxy group. In addition, these undercoat layer components may be used alone or in the form of a mixture of two or more types thereof. Details of the compound used in the undercoat layer and the method of forming the undercoat layer are described in paragraphs 0171 and 0172 of JP2009-175195A, and those described here are also applied to the present disclosure.

The coating amount of the undercoat layer is preferably in a range of 2 mg/m$^2$ to 200 mg/m$^2$ and more preferably in a range of 5 mg/m$^2$ to 100 mg/m$^2$. In a case where the coating amount is in the above-described range, sufficient printing durability is obtained.

<Back Coat Layer>

A back coat layer is provided on the rear surface of the support of the lithographic printing plate precursor according to the embodiment of the present disclosure, as necessary. As the back coat layer, coating layers formed of an organic polymer compound described in JP1993-045885A (JP-H05-045885A) or a metal oxide obtained by hydrolyzing and polycondensing an organic or inorganic metal compound described in JP1994-035174A (JP-H06-035174A) are preferably used. Among these coating layers, alkoxy compounds of silicon such as $Si(OCH_3)_4$, $Si(OC_2H_5)_4$, $Si(OC_3H_7)_4$, and $Si(OC_4H_9)_4$ are easily available at low cost, and coating layers of metal oxides obtained from these have excellent developer resistance, and thus, these are particularly preferable.

(Method of Producing Positive Type Lithographic Printing Plate Precursor)

A method of producing the positive type lithographic printing plate precursor according to the embodiment of the present disclosure is not particularly limited. For example, the underlayer, the interlayer, and the upper layer may be sequentially formed or may be formed using the following production method, and the following production method is preferable.

It is preferable that the method of producing the positive type lithographic printing plate precursor according to the embodiment of the present disclosure is a production method including a step of preparing a coating solution which contains the polymer compound 1 and the polymer compound 2; a step of coating a support which has a hydrophilic surface or a hydrophilic layer with the coating solution and drying the coating solution to form an underlayer and an interlayer through phase separation; and a step of forming an upper layer on the interlayer.

The present inventors found that, since the polymer compound 1 and the polymer compound 2 have different polarities and are not compatible with each other in many cases, phase separation occurs and two layers (the underlayer and the interlayer) can be formed from one coating solution in a case where the coating solution containing the polymer compound 1 and the polymer compound 2 is applied and dried.

In order to form the interlayer through phase separation in the underlayer, it is necessary that the polymer compound 1 and the polymer compound 2 are not substantially compatible with each other. It is considered that the polymer compound 1 and the polymer compound 2 are not compatible with each other because the polymer compound 2 has high polarity due to the introduction of a polar group to a side chain thereof and the polarities of two polymer compounds are separated from each other.

Further, in a case where the main chain skeleton of the polymer compound 1 is greatly different from the main chain skeleton of the polymer compound 2 even though the polymer compound 1 contains a functional group having high polarity, for example, polyurethane or polyurea which contains a sulfonamide group in the main chain is not substantially compatible and thus phase separation can be formed.

In a case where the content of the polymer compound 1 in the coating solution is greater than the content of the polymer compound 2, the polymer compound 1 becomes the underlayer and the polymer compound 2 becomes the interlayer due to the relationship between the polarities.

Therefore, since the polymer compound 1 having high printing durability is provided for the underlayer and the polymer compound 2 is provided for the interlayer, the abundance ratio between the polymer compound 1 and the polymer compound 2 in the coating solution for forming the underlayer and the interlayer is preferably in a range of 95:5 to 50:50, more preferably in a range of 90:10 to 60:40, and still more preferably in a range of 85:15 to 70:30 on a mass basis.

It is preferable that the coating solution containing the polymer compound 1 and the polymer compound 2 further contains a solvent.

The amount of the solvent is not particularly limited and may be set such that each component can be dissolved therein. Further, in consideration of the coatability, the amount of the solvent can be set such that a desired viscosity is obtained.

In order to obtain a desired viscosity of the coating solution from the viewpoint that the polymer compound 1 and the polymer compound 2 can be dissolved, are easily dried, and have high coatability, it is preferable that the above-described solvents are suitably combined and used.

Examples of the method of sequentially forming the underlayer and the interlayer include a method of using a difference between the solvent solubilities of the components contained in the underlayer in a solvent and the components contained in the interlayer in a solvent and a method of coating the interlayer, rapidly drying the solvent, and removing the solvent, as described in paragraphs 0068 and 0069 in JP2011-209343A. It is preferable that the latter method is used in combination because separation between layers is more favorably carried out.

Further, the interlayer can be formed by rapidly drying the coating solution for forming the interlayer after the liquid droplets are supplied by spraying or using an ink jet system.

From the viewpoint that the separation between layers becomes excellent, it is preferable that the time taken from the contact of the coating solution for forming the interlayer with the surface of the underlayer to the completion of drying of the coating solution is short, but the solvent is insufficiently dried in a case where the time is too short and the residual solvent may result in surface defects or image formation defects over time after the coating. Therefore, the time taken from the contact of the coating solution with the surface of the underlayer to the completion of drying of the coating solution is preferably in a range of 10 seconds to 90 seconds, more preferably in a range of 20 seconds to 80 seconds, and still more preferably in a range of 30 seconds to 60 seconds.

The formation of the upper layer is not particularly limited, but it is preferable that the upper layer is formed using a coating solution obtained by using a solvent that does not dissolve the interlayer.

The preferable aspects of preferable components for each layer in the method of producing the positive type lithographic printing plate precursor according to the embodiment of the present disclosure are the same as the preferable aspects described above.

Further, the formation of the support and the hydrophilic layer (undercoat layer) as necessary is also not particularly limited, and the preferable aspects for these are the same as the preferable aspects described above.

(Method of Preparing Lithographic Printing Plate)

A method of preparing a lithographic printing plate according to the embodiment of the present disclosure includes an exposure step of imagewise (a shape of a desired image or a character)-exposing the lithographic printing plate precursor, a development step of performing development using a developer, and a heat treatment (burning treatment) step as necessary in this order. Further, it is preferable that the method does not include the heat treatment step.

According to the method of preparing a lithographic printing plate according to the embodiment of the present disclosure, a lithographic printing plate with excellent chemical resistance and printing durability is obtained without performing a burning treatment.

Hereinafter, each step of the preparation method according to the embodiment of the present disclosure will be described in detail.

<Exposure Step>

The method of preparing the lithographic printing plate according to the embodiment of the present disclosure includes an exposure step of imagewise-exposing the positive type lithographic printing plate precursor according to the embodiment of the present disclosure.

As a light source of active light used in image exposure of the lithographic printing plate precursor according to the embodiment of the present disclosure, a light source having an emission wavelength in the near infrared region to the infrared region is preferable, and solid-state laser or semiconductor laser is more preferable. Among these, in the present disclosure, it is particularly preferable that image exposure is performed by solid-state laser or semiconductor laser emitting infrared rays having a wavelength of 750 nm to 1400 nm.

The output of the laser is preferably 100 mW or greater, and to shorten the exposure time, a multibeam laser device is preferably used. In addition, the exposure time per pixel is preferably within 20μ seconds.

Energy to be radiated to the lithographic printing plate precursor according to the embodiment of the present disclosure is preferably in a range of 10 mJ/cm$^2$ to 300 mJ/cm$^2$. In a case where the energy is in the above-described range, the laser ablation is suppressed, and thus damage to an image can be prevented.

In the exposure according to the present disclosure, it is possible to expose by overlapping a light beam of the light source. The overlapping means that the sub-scanning pitch width is smaller than the beam diameter. For example, when the beam diameter is expressed by the half-width (FWHM) of the beam intensity, the overlapping can be quantitatively expressed by FWHM/sub-scanning pitch width (overlap coefficient). In the present disclosure, this overlap coefficient is preferably 0.1 or greater.

The scanning method of the light source of an exposure apparatus which can be used in the present disclosure is not particularly limited, and a drum outer surface scanning method, a drum inner surface scanning method, a planar scanning method, or the like can be used. In addition, the channel of the light source may be a single channel or a multichannel, and in the case of drum outer surface scanning method, the multichannel is preferably used.

<Development Step>

The method of preparing the lithographic printing plate according to the embodiment of the present disclosure includes a development step of performing development using an alkali aqueous solution with a pH of 8.5 to 13.5 (hereinafter, also referred to as a "developer").

It is preferable that the developer used in the development step has a pH of 12.5 to 13.5.

Further, it is preferable that the developer contains a surfactant and more preferable that the developer contains at least an anionic surfactant or a nonionic surfactant. A surfactant contributes to improvement of processability.

As the surfactant used in the developer, any of an anionic surfactant, a nonionic surfactant, a cationic surfactant, and an amphoteric surfactant can be used, and as described above, an anionic surfactant or a nonionic surfactant is preferable.

As the anionic surfactant, the nonionic surfactant, the cationic surfactant, and the amphoteric surfactant used in the developer of the present disclosure, the surfactants described in paragraphs 0128 to 0131 of JP2013-134341A can be used.

In addition, from the viewpoint of stable solubility or turbidity in water, a surfactant preferably has a HLB value of 6 or greater and more preferably has a HLB value of 8 or greater.

As the surfactant used in the developer, an anionic surfactant or a nonionic surfactant is preferable, and an anionic surfactant containing sulfonic acid or sulfonate or a nonionic surfactant having an aromatic ring and an ethylene oxide chain is particularly preferable.

The surfactant can be used alone or in combination of two or more types thereof.

The content of the surfactant in the developer is preferably in a range of 0.01% by mass to 10% by mass, and more preferably in a range of 0.01% by mass to 5% by mass.

In a case where as a buffer, carbonate ions and hydrogencarbonate ions are included to maintain the pH of the developer at 8.5 to 13.5, it is possible to suppress variations in pH even in a case where the developer is used for a long period of time, and it is possible to suppress developability deterioration and a development scum occurrence due to the variation in pH. To make carbonate ions and hydrogencarbonate ions present in the developer, carbonate and hydrogencarbonate may be added to the developer, or by adjusting the pH after carbonate or hydrogencarbonate is added, carbonate ions and hydrogencarbonate ions may be generated. Although carbonate and hydrogencarbonate are not particularly limited, an alkali metal salt is preferable. Examples of the alkali metal include lithium, sodium, and potassium, and sodium is particularly preferable. These may be used alone or in combination of two or more types thereof.

The total amount of carbonate and hydrogencarbonate is preferably in a range of 0.3% by mass to 20% by mass, more preferably in a range of 0.5% by mass to 10% by mass, and particularly preferably in a range of 1% by mass to 5% by mass, with respect to the total mass of the developer. In a case where the total amount is 0.3% by mass or greater, developability and processing capability are not reduced, and in a case where the total amount is 20% by mass or less, a precipitate or a crystal is less likely to be produced and at the time of the waste liquid treatment of the developer, gelation when neutralizing is less likely to occur, and thus, trouble does not occur in the waste liquid treatment.

In addition, for the purpose of finely adjusting the alkali concentration or assisting dissolution of the non-image area photosensitive layer, supplementarily, other alkali agents, for example, organic alkali agents may be used in combination. Examples of the organic alkali agent include monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine, and tetramethylammonium hydroxide. Other alkali agents are used alone or in combination of two or more types thereof.

In addition to the above materials, the developer may contain a wetting agent, a preservative, a chelate compound, an antifoaming agent, an organic acid, an organic solvent, an inorganic acid, an inorganic salt, or the like. In a case where a water-soluble polymer compound is added, in particular, when the developer was fatigued, the plate surface is likely to be sticky, and thus, a water-soluble polymer compound is preferably not added.

As the wetting agent, the wetting agents described in paragraph 0141 of JP2013-134341A can be suitably used. The wetting agent may be used alone or in combination of two or more types thereof. The wetting agent is preferably used in an amount of 0.1% by mass to 5% by mass with respect to the total mass of the developing agent.

As the preservative, the preservatives described in paragraph 0142 of JP2013-134341A can be suitably used. Two or more preservatives are preferably used in combination such that the preservatives have effect of sterilization of various molds. The amount of the preservative to be added is an amount in which the effect is stably exhibited on bacteria, fungi, yeast or the like, and although the addition amount varies depending on the type of bacteria, molds, or yeast, the addition amount is preferably in a range of 0.01% by mass to 4% by mass with respect to the total mass of the developer.

As the chelate compound, the chelate compounds described in paragraph 0143 of JP2013-134341A can be suitably used. As the chelating agent, a chelating agent which is stably present in the developer composition and does not impair the printability is selected. The amount thereof to be added is suitably in a range of 0.001% by mass to 1.0% by mass with respect to the total mass of the developer.

As the antifoaming agent, the antifoaming agents described in paragraph 0144 of JP2013-134341A can be suitably used. The content of the antifoaming agent is suitably in a range of 0.001% by mass to 1.0% by mass with respect to the total mass of the developer.

As the organic acid, the antifoaming agents described in paragraph 0145 of JP2013-134341A can be suitably used. The content of the organic acid is preferably in a range of 0.01% by mass to 0.5% by mass with respect to the total mass of the developer.

Examples of the organic solvent include aliphatic hydrocarbons (hexane, heptane, "Isopar E, H, G" (manufactured by Exxon Chemical Company), gasoline, kerosene, and the like), aromatic hydrocarbons (toluene, xylene, and the like), halogenated hydrocarbons (methylene dichloride, ethylene dichloride, trichlene, monochlorobenzene, and the like), and polar solvents.

Examples of the polar solvent include alcohols (methanol, ethanol, propanol, isopropanol, benzyl alcohol, ethylene glycol monomethyl ether, 2-ethoxyethanol, and the like), ketones (methyl ethyl ketone, cyclohexanone, and the like), esters (ethyl acetate, methyl lactate, propylene glycol monomethyl ether acetate, and the like), others (triethyl phosphate, tricresyl phosphate, N-phenylethanolamine, N-phenyldiethanolamine, and the like).

In addition, in a case where the organic solvent is insoluble in water, it is also possible to use by solubilizing the organic solvent in water using a surfactant or the like. In a case where the developer contains an organic solvent, from the viewpoint of safety and inflammability, the concentration of the solvent is preferably less than 40% by mass.

Examples of the inorganic acid and the inorganic salt include phosphoric acid, metaphosphoric acid, ammonium primary phosphate, ammonium secondary phosphate, sodium primary phosphate, sodium secondary phosphate, potassium primary phosphate, potassium secondary phosphate, sodium tripolyphosphate, potassium pyrophosphate, sodium hexametaphosphate, magnesium nitrate, sodium nitrate, potassium nitrate, ammonium nitrate, sodium sulfate, potassium sulfate, ammonium sulfate, sodium sulfite, ammonium sulfite, sodium hydrogen sulfate, and nickel sulfate. The content of the inorganic salt is preferably in a range of 0.01% by mass to 0.5% by mass with respect to the total mass of the developer.

The temperature for the development is not particularly limited as long as the development can be performed at the temperature, and is preferably 60° C. or lower and more preferably in a range of 15° C. to 40° C. In the development treatment using an automatic developing device, the developer becomes fatigued according to the treatment amount, and thus the processing capability may be restored using a replenisher or a fresh developer. By automatically setting the reference electric conductivity that determines the timing for replenishing the development replenisher to a suitable value in consideration of the ratio between the processing fatigue and the carbon dioxide gas fatigue using an automatic developing device as described in JP1997-096910A (JP-H09-096910A), the activity of the developer may be maintained in an excellent state for a long period of time.

As one example of the development or the treatment after the development, a method of performing alkali development, removing the alkali in a post-water washing step, performing a gum treatment in a gumming step, and drying in a drying step can be exemplified. In addition, as another example, a method of performing pre-water washing, developing, and gumming at the same time by using an aqueous solution containing carbonate ions, hydrogencarbonate ions, and a surfactant can be preferably exemplified. Thus, particularly, the pre-water washing step may not be performed, and only by using one solution, pre-water washing, developing, and gumming are performed in one bath, and then, a drying step may be preferably performed. After the development, it is preferable that drying is performed after the excess developer is removed using a squeeze roller or the like. In a case where an unnecessary image area is present in the obtained lithographic printing plate, the unnecessary image area is removed. For removal, for example, a method of removing the unnecessary image area by coating the area with an erasing solution, allowing the area to stand for a predetermined time, and washing the area with water, as described in JP1990-013293B (JP-H02-013293B), is preferable, and a method of irradiating the unnecessary image area with active rays guided by optical fibers and performing development as described in JP1993-174842A (JP-H05-174842A) can also be used.

The development step can be suitably performed by an automatic treatment device equipped with a rubbing member. Examples of the automatic treatment device include an automatic treatment device which performs a rubbing treatment while transporting the lithographic printing plate precursor after image exposure, described in JP1990-220061A (JP-H02-220061A) and JP1985-059351A (JP-S60-059351A), and an automatic treatment device which performs a rubbing treatment on the lithographic printing plate precursor after image exposure, set on a cylinder while rotating the cylinder, described in U.S. Pat. Nos. 5,148,746A, 5,568,768A, and GB2297719B. Among these, as the rubbing member, an automatic treatment device using a rotating brush roll is particularly preferable.

The rotating brush roll used in the present disclosure can be suitably selected in consideration of the difficulty in flawing of the image area and the stiffness of the support of the lithographic printing plate precursor. As the rotating brush roll, a known rotating brush roll formed by implanting a brush material into a plastic or metal roll can be used. For example, the brush rolls described in JP1983-159533A (JP-S58-159533A) or JP1991-100554A (JP-H03-100554A) or a brush roll formed by closely and radially wrapping a metal or plastic grooved material into which a brush material has been implanted in a row on a plastic or metal roll which becomes a core, as described in JP1987-167253Y (JP-S62-167253Y), can be used.

As the brush material, plastic fibers (for example, polyester-based synthetic fibers such as polyethylene terephthalate and polybutylene terephthalate, polyamide-based synthetic fibers such as nylon 6.6 and nylon 6.10, polyacryl-based synthetic fibers such as polyacrylonitrile and alkyl poly(meth)acrylate, and polyolefin-based synthetic fibers such as polypropylene and polystyrene) can be used, and for example, a plastic fiber having a diameter of a fiber hair of 20 μm to 400 μm and a length of a hair of 5 mm to 30 mm can be suitably used.

The outer diameter of the rotating brush roll is preferably in a range of 30 mm to 200 mm, and the circumferential speed of the front end of the brush rubbing the plate surface is preferably in a range of 0.1 m/sec to 5 m/sec. A plurality of the rotating brush rolls is preferably used.

Although the rotation direction of the rotating brush roll may be the same direction or may be the reverse direction, with respect to the transporting direction of the lithographic printing plate precursor, in a case where two or more rotating brush rolls are used, it is preferable that at least one rotating brush roll rotates in the same direction and at least one rotating brush roll rotates in the reverse direction. Thus, removal of the photosensitive layer of the non-image area becomes more reliable. Furthermore, it is also effective to swing the rotating brush roll in the rotation axis direction of the brush roll.

After the development step, a continuous or discontinuous drying step is preferably performed. Drying is performed by hot air, infrared rays, or far infrared rays.

According to the method of preparing the lithographic printing plate according to the embodiment of the present disclosure, an automatic treatment device that performs development and gumming on the lithographic printing plate precursor in a developer tank and drying the positive type lithographic printing plate precursor in a drying portion to obtain a lithographic printing plate may be used.

<Heat Treatment (Burning Treatment) Step>

In the present disclosure, the lithographic printing plate obtained in the above-described manner is coated with a desensitizing gum as necessary and then may be subjected to a heat treatment (burning treatment), but it is preferable that the heat treatment is not performed.

The burning treatment is performed by heating the lithographic printing plate precursor in a temperature range of 150° C. to 350° C. using a burning processor (for example, a burning processor "BP-1300" sold by Fujifilm Corporation) or the like.

The heating temperature is preferably in a range of 150° C. to 350° C., more preferably in a range of 160° C. to 300° C., and still more preferably in a range of 180° C. to 270° C. Further, the heating time is preferably in a range of 1 minute to 20 minutes, more preferably in a range of 1 minute to 15 minutes, and still more preferably in a range of 1 minute to 10 minutes.

Optimal conditions for the heating temperature and the heating time are selected in consideration of the type of the component forming an image.

In a case of the burning treatment, it is preferable that a treatment is performed using a surface cleaning liquid as described in JP1986-002518B (JP-S61-002518B), JP1980-028062B (JP-S55-028062B), JP1987-031859A (JP-S62-031859A), and JP1986-159655A (JP-S61-159655A) before the burning treatment. Examples of the treatment method include a method of coating the lithographic printing plate with a surface cleaning liquid using a sponge or absorbent cotton impregnated with the surface cleaning liquid, a method of immersing a printing plate in a vat filled with a surface cleaning liquid to coat the printing plate with the surface cleaning liquid, and a method of coating the printing plate using an automatic coater. Further, in a case where the coating amount thereof is made uniform using a squeegee or a squeegee roller after the coating, more preferable effects can be obtained.

The coating amount of the surface cleaning liquid is preferably in a range of 0.03 g/m² to 0.8 g/m² (dry mass).

The lithographic printing plate which has been subjected to the burning treatment can be appropriately further subjected to a treatment such as washing with water or gumming, which has been performed in the related art, as necessary. However, in a case where a surface cleaning liquid containing a water-soluble polymer compound or the like is used, a so-called desensitizing treatment such as gumming can be omitted.

The lithographic printing plate obtained by performing such a treatment is provided for an offset printer or the like and used for printing a plurality of sheets.

EXAMPLES

Hereinafter, the present disclosure will be described in detail using examples, but the present disclosure is not limited thereto. In the examples, "part" indicates "part(s) by mass" unless otherwise specified.

Hereinafter, the details of various components used the following examples comparative examples will be described.

[Polymer Compound 1]

<Polyurethane P-1>

A diisocyanate compound and a diol compound represented by the following formulae were polymerized such that the molar ratio thereof was set to 1:1, thereby obtaining polyurethane P-1 (weight-average molecular weight of 36000).

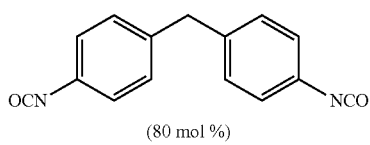

(80 mol %)

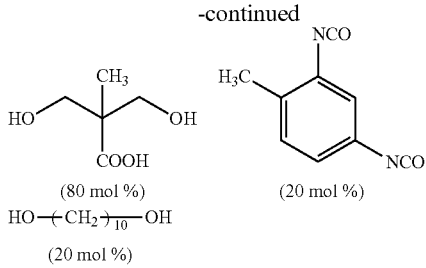

(80 mol %) (20 mol %)

HO—(CH₂)₁₀—OH (20 mol %)

<Polyurethanes P-2 and P-3>

The corresponding diol compound was allowed to react with the corresponding diisocyanate compound at 70° C. using NEOSTANN U-600 (manufactured by NITTO KASEI CO., LTD.: bismuth catalyst) as a catalyst in an N,N-dimethylacetamide (manufactured by Kanto Chemical Co., Inc.) solvent, thereby obtaining the following polyurethanes P-2 and P-3. Further, each numerical value on the lower right side of square brackets indicates the content ratio (molar ratio) of each constitutional unit.

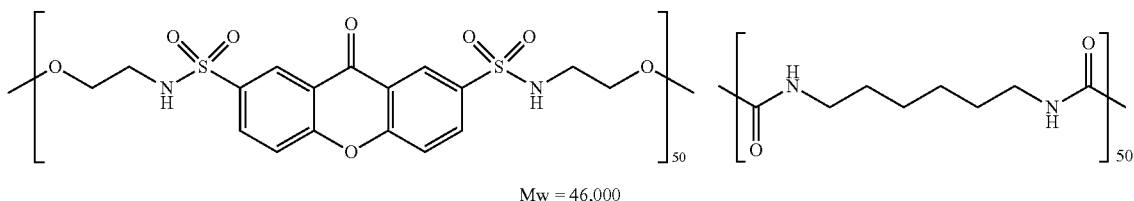

P-2

Mw = 46,000

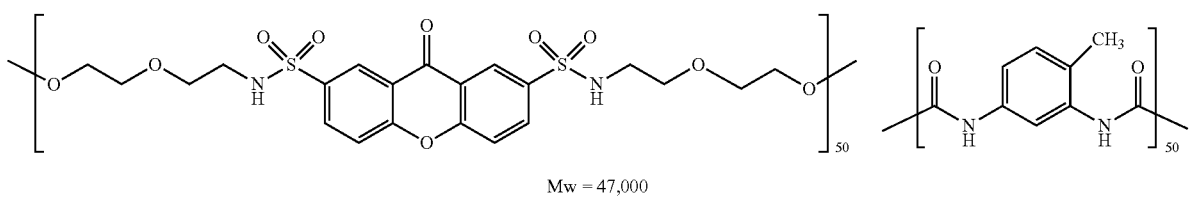

P-3

Mw = 47,000

<Polyvinyl Acetal P-4>

Polyvinyl acetal P-4 was prepared in the following manner.

BF-03 (polyvinyl acetal, manufactured by Chang Chun Petrochemical Co., Ltd., hydrolysis rate of 98%, Mw of 15000) (50 parts) was added to a reaction container containing dimethyl sulfoxide (200 parts), which was provided with a water cooled condenser, a dropping funnel, and a thermometer. The mixture was heated at 80° C. for 30 minutes until the mixture was turned into a transparent solution while being continuously stirred. Next, the temperature of the solution was adjusted to 60° C., and methansulfonic acid (99%) (2.7 parts) in dimethyl sulfoxide (50 parts) was added thereto. A solution containing butylaldehyde (10.4 parts) was added to the reaction mixture for 15 minutes, and the temperature thereof was maintained to 55° C. to 60° C. for 1 hour. 2-hydroxybenzaldehyde (salicylic acid aldehyde, 39 parts) in dimethyl sulfoxide (100 parts) was added to the reaction mixture. Next, the reaction mixture was diluted with anisole (350 parts), and vacuum distillation was started. An azeotropic mixture containing anisole was distilled from the reaction mixture (less than 0.1% of water remained in the solution). The reaction mixture was cooled to room temperature (25° C., the same applies hereinafter), neutralized by triethanolamine (8 parts) dissolved in dimethyl sulfoxide (30 parts), and blended with 6000 parts of water. The resulting generated precipitated polymer was washed with water, filtered, and dried in a vacuum at 50° C. for 24 hours, thereby obtaining 86 parts of dried polyvinyl acetal P-4. The Mw of P-4 was 52000.

<Polyurea P-5>

5.59 parts of B-1 obtained in the above-described manner, 1.52 parts of 3,5-diaminobenzoic acid (manufactured by Tokyo Chemical Industry Co., Ltd.), and 20.88 parts of N,N-dimethylacetamide were weighed in a three-neck flask provided with a condenser and a stirrer, and the temperature of the reaction solution was set to room temperature to obtain a uniform solution.

Next, 3.36 parts of hexamethylene diisocyanate (manufactured by Tokyo Chemical Industry Co., Ltd.) and 0.01 parts of NEOSTANN U-600 (manufactured by NITTO KASEI CO., LTD.: bismuth catalyst) were added to the reaction temperature in this order, the resulting solution was stirred at room temperature for 1 hour, and the solution was allowed to react at 60° C. for 3 hours. Next, 5 parts of methanol was added to the reaction solution for a further reaction at 90° C. for 2 hours, thereby obtaining a binder polymer having a weight-average molecular weight of 140000 (polyurea P-5, the polymer shown below). It was confirmed that whether the obtained product was the target substance based on the NMR spectrum, the IR spectrum, and GPC (in terms of polystyrene). Each numerical value on the lower right side of the square brackets indicates a content ratio (molar ratio) of each constitutional unit.

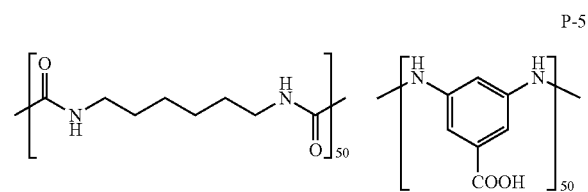

P-5

<Polyurea P-6>

139.82 parts of chlorosulfonic acid was weighed in a three-neck flask provided with a condenser and a stirrer, 29.43 parts of xanthone (manufactured by Tokyo Chemical Industry Co., Ltd.) was added thereto at room temperature, and the resulting solution was stirred at room temperature for 1 hour. The temperature of the reaction solution was raised to 80° C., and the reaction solution was stirred for 8 hours. This reaction solution was cooled to room temperature while being stirred, and crystallized in 2000 parts of ice-cold water, followed by stirring for 10 minutes. This was collected by filtration, and the collected product was dissolved in 2690 parts of ethyl acetate. This ethyl acetate solution was transferred to a separating funnel, washing with pure water and liquid-liquid separation was performed two times, and washing with saturated saline and liquid-liquid separation was performed. After the organic layer was transferred to an Erlenmeyer flask, 30 parts of magnesium sulfate was added thereto, followed by stirring, the solid content was removed by filtration, the ethyl acetate was distilled off using an evaporator, and the resulting product was vacuum-dried at 40° C. for 24 hours, whereby 28 g of a precursor S-1 (disulfonic acid chloride) which was a target substance was obtained. It was confirmed from the nuclear magnetic resonance (NMR) spectrum that the obtained product was the precursor (S-1). The precursor S-1 was analyzed using $^1$H-NMR. The result thereof is shown below.

$^1$H-NMR data (deuterated dimethyl sulfoxide (deuterated DMSO), 400 MHz, internal standard: tetramethylsilane)

δ(ppm)=7.62-7.65 (d, 2H), 8.02-8.05 (d, 2H), 8.40 (s, 2H)

36.06 parts of ethylenediamine (manufactured by Tokyo Chemical Industry Co., Ltd.) and 40 parts of tetrahydrofuran were weighed in a three-neck flask provided with a condenser and a stirrer, and the resulting mixture was stirred while being cooled to 0° C. to 5° C. 11.79 parts of the precursor (S-1) obtained in the above-described manner was dissolved in 66 parts of tetrahydrofuran, the solution was transferred to a dropping funnel, added dropwise to the three-neck flask for 1 hour during stirring, and stirred for 1 hour after the dropwise addition. When the temperature of the reaction solution was returned to room temperature and the reaction solution was stirred for 2 hours, since the solid component and the liquid component were separated from each other, the liquid component was decanted. Next, the solid component in the flask was dissolved in 150 parts of N,N-dimethylacetamide (manufactured by Kanto Chemical Co., Ltd.) and 20 parts of pure water and crystallized in 2000 parts of an aqueous solution in which 20 parts of sodium hydrogen carbonate was dissolved, and then the resultant was filtered. The filtrate was washed with 500 parts of pure water, washed with 445 parts of tetrahydrofuran, and filtered, thereby obtaining crystals. The crystals were vacuum-dried at 60° C. for 24 hours, whereby 10.1 parts of a target substance (SA-18) was obtained. It was confirmed from the NMR spectrum that the obtained product was the target substance.

The SA-18 was analyzed using $^1$H-NMR. The result thereof is shown below.

$^1$H-NMR data (deuterated DMSO, 400 MHz, internal standard: tetramethylsilane)

δ(ppm)=2.52-2.55 (t, 4H), 2.75-2.79 (t, 4H), 7.93-7.95 (d, 2H), 8.22-8.25 (d, 2H), 8.57 (s, 2H)

35.24 parts of SA-18, 0.078 parts of n-butylamine (manufactured by Wako Pure Chemical Industries, Ltd.), and 200.0 parts of N,N-dimethylacetamide (manufactured by Kanto Chemical Co., Inc.) were weighed in a three-neck flask provided with a condenser and a stirrer, and the temperature of the reaction solution was set to room temperature to obtain a uniform solution. Next, 15.54 parts of 1,3-bis (isocyanatomethyl)cyclohexane (manufactured by Tokyo Chemical Industry Co., Ltd.) and 80.0 parts of N,N-dimethylacetamide (manufactured by Kanto Chemical Co., Inc.) were weighed and added dropwise using a dropping funnel at room temperature for 30 minutes, and the resulting solution was stirred at room temperature for 30 minutes for a reaction. Subsequently, 1.00 parts of n-butylamine (manufactured by Wako Pure Chemical Industries, Ltd.) and 39.6 parts of methanol were added to the reaction solution, and the resulting solution was reacted at room temperature for 30 minutes.

The reaction solution was poured into a mixed solution of 2000 parts of pure water and 1580 parts of methanol, and as a result, a polymer was precipitated. The resultant was collected by filtration, washed, and dried, whereby 46.7 parts of a binder polymer (polyurea P-6) having a weight-average molecular weight of 53,000 was obtained.

It was confirmed that whether the obtained product was the target substance based on the NMR spectrum, the IR spectrum, and GPC (polystyrene conversion). The structure of the polyurethane P-5 is as shown below.

Each numerical value on the lower right side of the square brackets indicates a content ratio (molar ratio) of each constitutional unit.

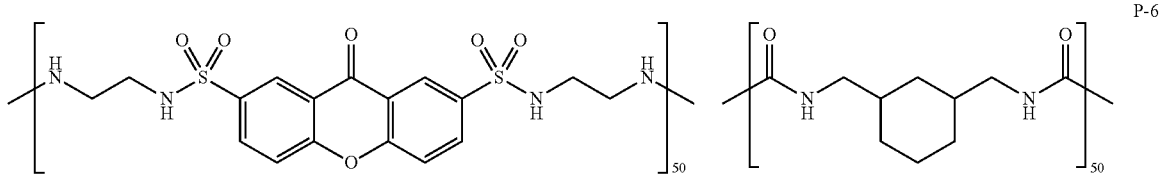

<Acrylic Resin P-14>
Copolymer (weight-average molecular weight of 50000) containing N-phenylmaleimide, methacrylic acid, and methacrylamide at molar ratio of 60:15:25
[Polymer Compound 2]
<Sulfonamide Group-containing Acrylic Resin P-7>
Copolymer (weight-average molecular weight of 65000) containing N-(p-aminosulfonylphenyl)methacrylamide, methyl methacrylate, and acrylonitrile at molar ratio of 35:35:30
<Sulfonamide Group-containing Acrylic Resin P-8>
The following monomer was synthesized according to the method described in Markromoleculare Cheme (Hofmann et al.), Vol. 177, p. 1791 to 1813 (1976).

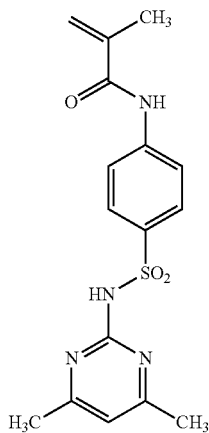

The monomer containing 160 mmol of a sulfonamide group, 20.6 g (132 mmol) of benzylacetamide, 2.31 g (32 mmol) of acrylic acid, and 104 g of γ-butyrolactone were added to a 250 ml reaction container, and the mixture was heated to 140° C. while being stirred at 200 rpm. The reaction was performed under nitrogen reflux. The solid content was dissolved, and the reaction container was cooled to 100° C. A solution obtained by dissolving 0.37 ml of TRIGONOX DC50 (manufactured by AKZO NOBEL N. V.) and 1.48 ml of TRIGONOX 141 (manufactured by AKZO NOBEL N. V) in 3.66 ml of butyrolactone was sequentially added to the reaction container. After initiation of the reaction, the temperature of the reaction container was set to 143° C., and 1.87 ml of TRIGONOX DC50 was added thereto for 2 hours or longer. The reaction mixture was stirred at 400 rpm and allowed to react at 140° C. for 2 hours. The reaction mixture was cooled to 120° C. and the stirring condition was changed by increasing the stirring rate to 500 rpm. 86.8 ml of 1-methyl-2-propanol was added to the reaction mixture, and the temperature thereof was decreased to room temperature.

The structure of the polymer was confirmed in terms of polystyrene based on a mixed column using dimethylacetamide/0.21% LiCl as a standard according to $^1$H-NMR spectrography and size exclusion chromatography.

The Mw of the sulfonamide group-containing acrylic resin P-8 shown below was 66000. Further, each numerical value on the lower right side of square brackets indicates the content ratio (molar ratio) of each constitutional unit.

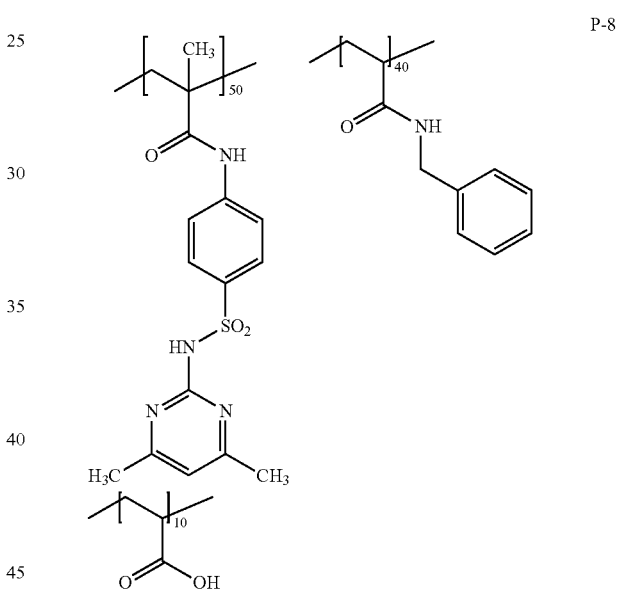

<Maleimide-containing Acrylic Resin P-9>
Copolymer (weight-average molecular weight of 63000) containing N-phenylmaleimide, N-4-methylphenylmaleimide, acrylonitrile, and methacrylate at molar ratio of 30:30:20:20
<Maleimide-containing Acrylic Resin P-10>
Copolymer (weight-average molecular weight of 61000) containing N-phenylmaleimide, N-methylphenylmaleimide, acrylonitrile, and N-hydroxyphenylmaleimide at molar ratio of 30:20:20:30
<Urea-containing Novolac Resin P-11>
Ethanol anhydride (473 parts), 91.89 parts of guanidine carbonate, and 146.1 parts of ethyl acetoacetate were added to a flask. The reaction solution was slowly heated to the reflux temperature and stirred overnight. Ethanol (237 parts) of ethanol was evaporated, and the reaction mixture was heated under reflux for 2 hours. The reaction mixture was cooled, and 196 parts of hexane was added to the reaction mixture. The obtained precipitate was filtered, washed, and dried. As the result, 119.3 parts of 6-methyl-isocytosine was obtained.

280.48 parts of dried N,N-dimethylacetamide and 43.76 parts of dried 6-methyl-isocytosine were added to a flask equipped with a silica gel drying tube. 66.22 parts of isophorone diisocyanate was added to this mixture. The mixture was stirred at room temperature for 5 days. The obtained mixture was used as follows without performing another treatment.

50 parts of a novolac resin and 125 parts of dried N,N-dimethylacetamide were added to a flask equipped with a silica gel drying tube. Further, 16.9 parts of the mixture obtained in the above-described manner and 0.5 parts of dibutyltin dilaurate were added thereto. After the mixture was stirred at 60° C. for 12 hours. The reaction mixture was poured into water. The precipitate was filtered to obtain a novolac resin. The resultant was dried in a vacuum at 40° C., thereby obtaining a urea-containing novolac resin P-11. The yield thereof was 90%.

[Polymer Compound 3]
<Novolac Resin P-12>

Copolymer containing m-cresol, p-cresol, and phenol at molar ratio of 3:2:5, Mw of 8000

<Phenolic Hydroxyl Group-containing Acrylic Resin P-13>

Copolymer containing hydroxyphenylacrylamide, α-methylstyrene, and acrylonitrile at molar ratio of 35:35:30 (weight-average molecular weight of 60000)

Examples 1 to 41 and Comparative Examples 1 to 8

[Preparation of Support A]
<Treatment>

(a) Mechanical Roughening Treatment (Brush Grain Method)

While supplying a suspension of pumice (specific gravity of 1.1 g/cm$^3$) to the surface of an aluminum plate as a polishing slurry liquid, a mechanical roughening treatment was performed using rotating bundle bristle brushes.

The median diameter (μm) of a polishing material was 30 μm, the number of the brushes was four, and the rotation speed (rpm) of the brushes was set to 250 rpm. The material of the bundle bristle brushes was nylon-6.10, the diameter of the brush bristles was 0.3 mm, and the bristle length was 50 mm. The brushes were produced by implanting bristles densely into the holes in a stainless steel cylinder having φ300 mm. The distance between two support rollers (φ200 mm) of the lower portion of the bundle bristle brush was 300 mm. The bundle bristle brushes were pressed until the load of a driving motor for rotating the brushes became 10 kW plus with respect to the load before the bundle bristle brushes were pressed against the aluminum plate. The rotation direction of the brushes was the same as the moving direction of the aluminum plate.

(b) Alkali Etching Treatment

The aluminum plate obtained above was subjected to an etching treatment by spraying a caustic soda aqueous solution in which the concentration of caustic soda was 26% by mass and the concentration of aluminum ions was 6.5% by mass using a spray tube at a temperature of 70° C. Thereafter, washing with water by spraying was performed. The amount of aluminum dissolved was 10 g/m$^2$.

(c) Desmutting Treatment in Acidic Aqueous Solution

Next, a desmutting treatment was performed in a nitric acid aqueous solution. As the nitric acid aqueous solution used in the desmutting treatment, the waste liquid of nitric acid used in electrochemical roughening of the next step was used. The liquid temperature was 35° C. The desmutting treatment was performed for 3 seconds by spraying the desmutting liquid using a spray.

(d) Electrochemical Roughening Treatment

An electrochemical roughening treatment was continuously performed using an AC voltage of nitric acid electrolysis 60 Hz. As the electrolyte at this time, an electrolyte which had been adjusted to have a concentration of aluminum ions of 4.5 g/L by adding aluminum nitrate to a nitric acid aqueous solution having a concentration of 10.4 g/L at a temperature of 35° C. was used. Using a trapezoidal rectangular waveform AC having a time tp until the current value reached a peak from zero of 0.8 msec and the duty ratio of 1:1 as the AC power source waveform, the electrochemical roughening treatment was performed using a carbon electrode as a counter electrode. As an auxiliary anode, ferrite was used. The current density was 30 A/dm$^2$ as the peak current value, and 5% of the current from the power source was separately flowed to the auxiliary anode. The electric quantity (C/dm$^2$) was 185 C/dm$^2$ as the sum total of electric quantity at the time of anodization of the aluminum plate. Thereafter, washing with water by spraying was performed.

(e) Alkali Etching Treatment

The aluminum plate obtained above was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.5 g/m$^2$.

(f) Desmutting Treatment in Acidic Aqueous Solution

Next, a desmutting treatment was performed in a sulfuric acid aqueous solution. As the sulfuric acid aqueous solution used in the desmutting treatment, a solution in which the concentration of sulfuric acid was 170 g/L and the concentration of aluminum ions was 5 g/L was used. The liquid temperature was 30° C. The desmutting treatment was performed for 3 seconds by spraying the desmutting liquid using a spray.

(g) Electrochemical Roughening Treatment

An electrochemical roughening treatment was continuously performed using an AC voltage of hydrochloric acid electrolysis 60 Hz. As the electrolyte, an electrolyte which had been adjusted to have a concentration of aluminum ions of 4.5 g/L by adding aluminum chloride to a hydrochloric acid aqueous solution having a concentration of 6.2 g/L at a liquid temperature of 35° C. was used. Using a trapezoidal rectangular waveform AC having a time tp until the current value reached a peak from zero of 0.8 msec and the duty ratio of 1:1, the electrochemical roughening treatment was performed using a carbon electrode as a counter electrode. As an auxiliary anode, ferrite was used.

The current density was 25 A/dm$^2$ as the peak current value, and the electric quantity (C/dm$^2$) in the hydrochloric acid electrolysis was 63 C/dm$^2$ as the sum total of electric quantity at the time of anodization of the aluminum plate. Thereafter, washing with water by spraying was performed.

(h) Alkali Etching Treatment

The aluminum plate obtained above was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.1 g/m$^2$.

(i) Desmutting Treatment in Acidic Aqueous Solution

Next, a desmutting treatment was performed in a sulfuric acid aqueous solution. Specifically, the desmutting treatment was performed at a liquid temperature of 35° C. for 4 seconds using the waste liquid (aluminum ions having a concentration of 5 g/L were dissolved in a sulfuric acid aqueous solution having a concentration of 170 g/L) generated in the anodization treatment step. The desmutting treatment was performed for 3 seconds by spraying the desmutting liquid using a spray.

(j) Anodization Treatment

An anodization treatment was performed using an anodization apparatus (the length of each of a first electrolytic portion and a second electrolytic portion was 6 m, the length of each of a first feeding portion and a second feeding portion was 3 m, and the length of each of a first feeding electrode and a second feeding electrode was 2.4 m) of a two-stage feeding electrolytic treatment method. As the electrolyte supplied to the first electrolytic portion and the second electrolytic portion, sulfuric acid was used. All electrolytes have a concentration of sulfuric acid of 50 g/L (including 0.5% by mass of aluminum ions) and were at a temperature of 20° C. Thereafter, washing with water by spraying was performed.

(k) Silicate Treatment

To ensure hydrophilicity of the non-image area, a silicate treatment was performed by dipping at 50° C. for 7 seconds using 2.5% by mass No. 3 sodium silicate aqueous solution. The amount of Si attached was 10 mg/m². Thereafter, washing with water by spraying was performed.

<Formation of Undercoat Layer>

The support prepared in the above-described manner was coated with an undercoat layer coating solution 1 described below, and the coating solution was dried at 80° C. for 15 seconds to provide an undercoat layer, thereby preparing a support A. The coating amount after drying was 15 mg/m².

—Undercoat Layer Coating Solution 1—

Following copolymer having weight-average molecular weight of 28000: 0.3 parts
Methanol: 100 parts
Water: 1 part

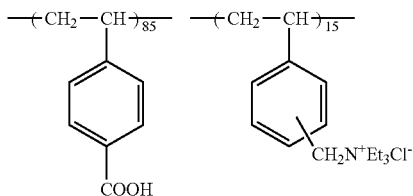

Further, Et represents an ethyl group, and each numerical value on the lower right side of square brackets indicates the molar ratio.

[Case where Underlayer was Coated with Interlayer (Examples 1 to 19 and Comparative Examples 1 to 5)]

<Formation of Image Recording Layer>

The support on which the undercoat layer had been provided was coated with a coating solution for an underlayer with the following composition such that the coating amount after drying of the coating solution reached 1.1 g/m² using a bar coater, and the coating solution was dried at 140° C. for 60 seconds to form a coated film.

Thereafter, the coated film was coated with a coating solution composition (II) for forming an interlayer with the following composition such that the coating amount after drying of the coating solution composition reached the film thickness of the interlayer listed in the following tables using a bar coater, and the coating solution was dried at 140° C. for 60 seconds to form a coated film.

Thereafter, the coated film was coated with a coating solution composition (III) for forming an upper layer with the following composition such that the coating amount after drying of the coating solution composition reached 0.26 g/m² using a bar coater, and the coating solution was dried at 140° C. for 30 seconds, thereby preparing respective positive type lithographic printing plate precursor of the examples and the comparative examples.

(Coating Solution Composition (I) for Forming Underlayer)

Polymer compound 1 listed in tables: 3.5 parts
Infrared absorbent (IR coloring agent (1): following structure): 0.2 parts
4,4'-Bishydroxyphenyl sulfone: 0.3 parts
Tetrahydrophthalic acid: 0.4 parts
p-Toluenesulfonic acid: 0.02 parts
3-Methoxy-4-diazodiphenylamine hexafluorophosphate: 0.06 parts
Product obtained by replacing counter ion of ethyl violet with 6-hydroxynaphthalenesulfonic acid: 0.15 parts
Fluorine-based surfactant (MEGAFACE F-780, manufactured by DIC Corporation): 0.07 parts
Methyl ethyl ketone: 30 parts
1-Methoxy-2-propanol: 15 parts
γ-Butyrolactone: 15 parts
IR Coloring Agent (1)

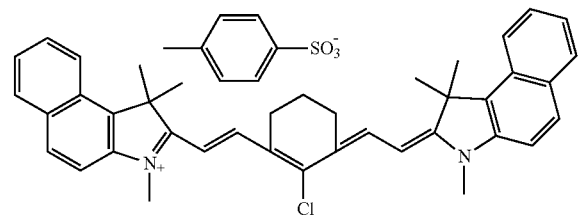

(Composition (II) for Forming Interlayer)

Polymer compound 2 listed in tables: 1 part
γ-Butyrolactone: 15 parts
Methyl ethyl ketone: 30 parts
1-Methoxy-2-propanol: 15 parts (Coating Solution Composition (III) for Forming Upper Layer)

Polymer compound 3 listed in tables: 0.68 parts
Infrared absorbent (IR coloring agent (1): above structure): 0.045 parts
Fluorine-based surfactant (MEGAFACE F-780, manufactured by DIC Corporation): 0.03 parts
Methyl ethyl ketone: 15.0 parts
1-Methoxy-2-propanol: 30.0 parts
5-Benzoyl-4-hydroxy-2-methoxybenzenesulfonate of 1-(4-methylbenzyl)-1-phenylpiperidinium: 0.01 parts

[Case Where Underlayer was Coated with Interlayer (Example 40)]

A positive type lithographic printing plate precursor of Example 40 was prepared in the same manner as in Example 3 except that 3-methoxy-4-diazodiphenylamine hexafluorophosphate in the coating solution (I) for forming an underlayer was changed to the onium salt compound ON-3.

[Case Where Underlayer was Coated with Interlayer (Comparative Example 6)]

The support on which the undercoat layer had been provided was coated with a coating solution composition (V) for forming an underlayer with the following composition such that the coating amount after drying of the coating solution composition reached 1.1 g/m² using a bar coater, and the coating solution composition was dried at 140° C. for 60 seconds to form a coated film.

Thereafter, the coated film was coated with a coating solution composition (VI) for forming an interlayer with the following composition such that the coating amount after drying of the coating solution composition reached the film thickness of the interlayer listed in the following tables using a bar coater, and the coating solution was dried at 160° C. for 40 seconds to form a coated film.

Thereafter, the coated film was coated with a coating solution composition (VII) for forming an upper layer with the following composition such that the coating amount after drying of the coating solution composition reached 0.4 g/m² using a bar coater, and the coating solution was dried at 130° C. for 40 seconds, thereby preparing a positive type lithographic printing plate precursor of Comparative Example 6.

(Coating Solution (V) for Forming Underlayer)
Polymer compound P-14 described above: 3.2 parts
Infrared absorbent (IR coloring agent (1): structure shown above): 0.94 parts
Crystal violet: 0.08 parts
MEGAFACE F-177: 0.05 parts
γ-Butyrolactone: 10.0 parts
Methyl ethyl ketone: 61.0 parts
1-Methoxy-2-propanol: 14.0 parts
Water: 9.34 parts
(Composition (VI) for Forming Interlayer)
Specific polymer compound P-7 described above: 3.50 parts
MEGAFACE F-177: 0.02 parts
γ-Butyrolactone: 20.0 parts
Methyl ethyl ketone: 60.0 parts
1-Methoxy-2-propanol: 20.0 parts
(Coating Solution Composition (VII) for Forming Upper Layer)
Polymer compound P-1 described above: 10.0 parts
Ethyl violet: 0.03 parts
MEGAFACE F-177: 0.05 parts
3-Pentanone: 60.0 parts
Propylene glycol monomethyl ether-2-acetate: 8.0 parts

[Case where Interlayer was Formed by Phase Separation from Underlayer (Examples 20 to 39 and Comparative Examples 7 and 8)]

<Formation of Image Recording Layer>

The support on which the undercoat layer had been provided was coated with a coating solution composition (IV) for forming an underlayer and an interlayer with the following composition such that the coating amount after drying of the coating solution composition reached 1.1 g/m² using a bar coater, and the coating solution composition was dried at 140° C. for 60 seconds to form a coated film.

Thereafter, the coated film was coated with the coating solution composition (III) for forming an upper layer such that the coating amount after drying of the coating solution composition reached 0.26 g/m² using a bar coater, and the coating solution composition was dried at 140° C. for 30 seconds, thereby preparing respective positive type lithographic printing plate precursor of the examples and the comparative examples.

[Case where Interlayer was Formed by Phase Separation from Underlayer (Example 41)]

A positive type lithographic printing plate precursor of Example 41 was prepared in the same manner as in Example 22 except that 3-methoxy-4-diazodiphenylamine hexafluorophosphate in the coating solution (IV) for forming an underlayer and an interlayer was changed to the onium salt compound ON-3.

(Coating Solution (IV) for Forming Underlayer and Interlayer)
Polymer compound 1 listed in tables: addition amount listed in tables
Polymer compound 2 listed in tables: addition amount listed in tables
Infrared absorbent (IR coloring agent (1): structure shown above): 0.2 parts
4,4'-Bishydroxyphenyl sulfone: 0.3 parts
Tetrahydrophthalic acid: 0.4 parts
p-Toluenesulfonic acid: 0.02 parts
3-Methoxy-4-diazodiphenylamine hexafluorophosphate: 0.06 parts
Product obtained by replacing counter ion of ethyl violet with 6-hydroxynaphthalenesulfonic acid: 0.15 parts
Fluorine-based surfactant (MEGAFACE F-780, manufactured by DIC Corporation): 0.07 parts
Methyl ethyl ketone: 30 parts
1-Methoxy-2-propanol: 15 parts
γ-Butyrolactone: 15 parts <Observation of Phase Separation Formation State in Interlayer and Underlayer>

Each cross section of the image recording layer obtained by cutting each of the obtained lithographic printing plate precursors of Examples 1 to 41 and Comparative Examples 1 to 8 using a microtome or the like was made to have a conductivity, imaged with a scanning electron microscope (SEM), and then observed. In a case where a clear contrast was unlikely to be obtained, the cut cross section was appropriately immersed in an alkali aqueous solution obtained by diluting a developer XP-D (manufactured by Fujifilm Corporation) with pure water to 10 times for 1 second to 5 seconds to obtain an image with a contrast based on a difference in alkali-solubility between the polymer compounds 1, 2, and 3.

In the lithographic printing plate precursors of Examples 1 to 41, an interlayer having a thickness of approximately 10 nm to 30 nm was formed between the underlayer and the upper layer. Further, in the lithographic printing plate precursors of Comparative Examples 1, 2, 4, and 7, a clear interlayer was not found.

Further, the presence of the dispersed phase in each underlayer of the lithographic printing plate precursors of Examples 20 to 39 and 41, and Comparative Example 5 was confirmed. The size of the dispersed phase was in a range of 0.05 μm to 0.55 μm. Meanwhile, each underlayer of Comparative Examples 1 to 4 and Examples 6 to 8 had a uniform phase, and a clear dispersed phase was not found.

<Evaluation of Image Formability>

Each of the prepared lithographic printing plate precursors was immersed in a container into which a developer XP-D (manufactured by Fujifilm Corporation) (which was made to have a conductivity of 43 mS/cm by dilution, pH of 13.1, 30° C.) while changing the time every 2 seconds and washed with water. The cyan density of the recording layer in unexposed portions at each immersion time was measured using an optical densitometer (manufactured by GretagMacbeth Company).

Next, the entire surface was exposed at a beam intensity of 15 W and a drum rotation speed of 150 rpm using a Trendsetter (manufactured by Creo Company), and the cyan density of the recording layer in exposed portions was measured in the same manner as described above.

In a case where a time for which the density of unexposed portions was maintained at 3% or greater with respect to the density at the immersion time of 0 second was set as a and a time taken until the cyan density of exposed portions completely reached the density of the support was set as b, the value of a-b was acquired and then used as the standard for evaluation of the image formability. As the obtained value was larger, it was evaluated that the effect of promoting the dissolution at the time of exposure was high, the dissolution discrimination was excellent, and the image formability were excellent.

The image formability was scored as 1 point in a case where a-b was less than 0, the image formability was scored as 2 points in a case where a-b was 0 or greater and less than 5, the image formability was scored as 3 points in a case where a-b was 5 or greater and less than 10, the image formability was scored as 4 points in a case where a-b was 10 or greater and less than 15, and the image formability was scored as 5 points in a case where a-b was 15 or greater. The image formability was evaluated as excellent in a case of 4 points or greater.

The results are listed in Tables 1 to 4.

<Evaluation of Printing Durability of UV Ink>

—Exposure and Development—

Drawing of a test pattern in an image was performed on each of the positive type lithographic printing plate precursors obtained in the above-described manner using a Trendsetter (manufactured by Creo Company) at a beam intensity of 15 W and a drum rotation speed of 150 rpm. Thereafter, using PS PROCESSOR LP940H (manufactured by Fujifilm Corporation) charged with a developer XP-D (which was made to have a conductivity of 43 mS/cm by dilution, pH of 13.1) (manufactured by Fujifilm Corporation), development was performed at a development temperature of 30° C. for a development time which was two seconds longer than the value of b obtained from the evaluation of the image formability.

In the above-described manner, lithographic printing plates of Examples 1 to 41 and Comparative Examples 1 to 8 were respectively obtained.

—Printing (Evaluation of Printing Durability Using Ultraviolet Curable Ink (UV Ink))—

The obtained lithographic printing plates were continuously printed using a printer DAIYA 1F-2 (manufactured by Mitsubishi Heavy Industries Ltd.). As the ink, BEST CURE BF WRO black ink (UV ink) (manufactured by T& K TOKA CO., LTD.) was used. At this time, by visually measuring how many sheets could be printed while maintaining a sufficient ink density, the printing durability of UV ink was evaluated. As the number of sheets was larger, the printing durability of UV ink was excellent. In a case where the number of sheets was 50000 or greater, the printing durability was evaluated as excellent. The results are listed in Tables 1 to 4.

<Evaluation 1 of Chemical Resistance>

Printing was performed in the same manner as in the evaluation of the printing durability described above. At this time, every time 5,000 sheets were printed, a step of reciprocally wiping the plate surface five times with a polystyrene (PS) sponge containing a cleaner (FD plate cleaner, manufactured by TOYO INK CO., LTD.) was performed, and the chemical resistance was evaluated. The chemical resistance was evaluated as 5 in a case where the printing durability at this time was 80% to 100% of the number of printed sheets, the chemical resistance was evaluated as 4 in a case where the printing durability was 60% to 80% of the number of printed sheets, the chemical resistance was evaluated as 3 in a case where the printing durability was 40% to 60% of the number of printed sheets, the chemical resistance was evaluated as 2 in a case where the printing durability was 20% to 40% of the number of printed sheets, and the chemical resistance was evaluated as 1 in a case where the printing durability was less than 20% of the number of printed sheets. Even in a case where the step of wiping the plate surface with a cleaner was performed, as the change in the printing durability index was smaller, the chemical resistance was evaluated as excellent. The results are listed in Tables 1 to 4.

<Evaluation 2 of Chemical Resistance>

1 ml of UV WASH 58 (manufactured by LOHAS PRINT Inc.) was added dropwise to a 50% halftone dot image area of each of the obtained lithographic printing plates, allowed to stand for 10 minutes, and washed with water, a step of reciprocally wiping the plate surface twice with a polystyrene (PS) sponge containing a PS gum liquid GU-7 (manufactured by Fujifilm Corporation) was performed.

The lithographic printing plates were continuously printed using a printer DAIYA 1F-2 (manufactured by Mitsubishi Heavy Industries Ltd.). As the ink, BEST CURE BF WRO black ink (UV ink) (manufactured by T& K TOKA CO., LTD.) was used.

After 500 sheets were printed, the halftone dot image area on the surface of each printed sheet was observed, the extent of damage to the halftone dot image in the dropped portion was visually observed, and sensory evaluation was performed. At this time, the chemical resistance was evaluated as 5 in a case where the trace resulting from the dropwise addition was not identified, the chemical resistance was evaluated as 4 in a case where halftone dots in the dropped portion were somewhat narrow and the trace resulting from the dropwise addition was identified, the chemical resistance was evaluated as 3 in a case where halftone dots in the dropped portion were narrow and remaining halftone dots became somewhat faint, the chemical resistance was evaluated as 2 in a case where most of the halftone dots in the dropped portion became faint, and the chemical resistance was evaluated as 1 in a case where halftone dots in the dropped portion were completely eliminated. The acceptable level was 4 or greater. The results are listed in Tables 1 to 4.

TABLE 1

|  |  | Example 1 | Example 2 | Example 3 | Example 40 | Example 4 | Example 5 | Example 6 | Comparative Example 1 |
|---|---|---|---|---|---|---|---|---|---|
| Underlayer | Polymer compound 1 | P-1 | P-2 | P-3 | P-3 | P-4 | P-5 | P-6 | P-1 |
| Interlayer | Polymer compound 2 | P-7 | P-7 | P-7 | P-7 | P-7 | P-7 | P-7 | Not present |

TABLE 1-continued

|  |  |  |  |  |  |  |  |  |  |
|---|---|---|---|---|---|---|---|---|---|
|  | Film thickness | 30 nm | 30 nm | 30 nm | 30 nm | 30 nm | 30 nm | 30 nm | 0 |
| Upper layer | Polymer compound 3 | P-12 | P-12 | P-12 | P-12 | P-12 | P-12 | P-12 | P-12 |
| Evaluation | Printing durability of UV ink (sheets) | 60000 | 60000 | 60000 | 60000 | 60000 | 60000 | 60000 | 60000 |
|  | Evaluation 1 of chemical resistance (scores) | 4 | 4 | 5 | 5 | 4 | 4 | 5 | 2 |
|  | Evaluation 2 of chemical resistance (scores) | 4 | 4 | 5 | 5 | 4 | 4 | 5 | 2 |
|  | Image formability (scores) | 5 | 5 | 5 | 5 | 5 | 5 | 5 | 5 |

|  |  | Comparative Example 2 | Comparative Example 3 | Example 7 | Example 8 | Example 9 | Example 10 | Comparative Example 4 |
|---|---|---|---|---|---|---|---|---|
| Underlayer | Polymer compound 1 | P-7 | P-12 | P-1 | P-1 | P-1 | P-1 | P-1 |
| Interlayer | Polymer compound 2 | P-7 | P-7 | P-8 | P-9 | P-10 | P-11 | P-4 |
|  | Film thickness | 0 | 30 nm | 30 nm | 30 nm | 30 nm | 30 nm | 0 |
| Upper layer | Polymer compound 3 | P-12 | P-12 | P-12 | P-12 | P-12 | P-12 | P-12 |
| Evaluation | Printing durability of UV ink (sheets) | 30000 | 20000 | 60000 | 60000 | 60000 | 60000 | 6500 |
|  | Evaluation 1 of chemical resistance (scores) | 5 | 3 | 4 | 4 | 4 | 4 | 2 |
|  | Evaluation 2 of chemical resistance (scores) | 5 | 2 | 4 | 4 | 4 | 4 | 1 |
|  | Image formability (scores) | 5 | 5 | 5 | 5 | 5 | 4 | 5 |

TABLE 2

|  |  | Example 11 | Example 12 | Example 13 | Example 14 | Example 15 | Example 16 | Comparative Example 5 | Example 17 | Example 18 | Example 19 | Comparative Example 6 |
|---|---|---|---|---|---|---|---|---|---|---|---|---|
| Underlayer | Polymer compound 1 | P-1 | P-1 | P-1 | P-1 | P-1 | P-1 | P-1 | P-4 | P-4 | P-4 | P-14 |
| Interlayer | Polymer compound 2 | P-7 | P-7 | P-7 | P-7 | P-7 | P-7 | P-7 | P-8 | P-9 | P-9 | P-7 |
|  | Film thickness | 10 nm | 20 nm | 50 nm | 200 nm | 30 nm | 30 nm | 30 nm | 30 nm | 30 nm | 30 nm | 30 nm |
| Upper layer | Polymer compound 3 | P-12 | P-12 | P-12 | P-12 | P-4 | P-13 | Not present | P-12 | P-12 | P-4 | P-1 |
| Evaluation | Printing durability of UV ink (sheets) | 60000 | 60000 | 60000 | 60000 | 65000 | 60000 | — | 60000 | 60000 | 60000 | 45000 |
|  | Evaluation 1 of chemical resistance (scores) | 4 | 4 | 4 | 5 | 4 | 4 | — | 4 | 4 | 4 | 4 |
|  | Evaluation 2 of chemical resistance (scores) | 4 | 4 | 4 | 5 | 4 | 4 | — | 4 | 4 | 4 | 3 |
|  | Image formability (scores) | 5 | 5 | 5 | 5 | 4 | 4 | 1 | 5 | 5 | 5 | 3 |

TABLE 3

|  |  | Example 20 | Example 21 | Example 22 | Example 41 | Example 23 | Example 24 |
|---|---|---|---|---|---|---|---|
| Underlayer | Polymer compound 1 | P-1 | P-2 | P-3 | P-3 | P-4 | P-5 |
|  | Addition amount in coating solution (IV) | 2.8 parts | 2.8 parts | 2.8 parts | 2.8 parts | 2.8 parts | 2.8 parts |
| Interlayer | Polymer compound 2 | P-7 | P-7 | P-7 | P-7 | P-7 | P-7 |
|  | Addition amount in coating solution (IV) | 0.7 parts | 0.7 parts | 0.7 parts | 0.7 parts | 0.7 parts | 0.7 parts |
| Upper layer | Polymer compound 3 | P-12 | P-12 | P-12 | P-12 | P-12 | P-12 |
| Evaluation | Printing durability of UV ink (sheets) | 60000 | 60000 | 60000 | 60000 | 60000 | 60000 |
|  | Evaluation 1 of chemical resistance (scores) | 4 | 4 | 5 | 5 | 4 | 4 |
|  | Evaluation 2 of chemical resistance (scores) | 4 | 4 | 5 | 5 | 4 | 4 |
|  | Image formability (scores) | 5 | 5 | 5 | 5 | 5 | 5 |

|  |  | Example 25 | Comparative Example 7 | Example 26 | Example 27 | Example 28 | Example 29 |
|---|---|---|---|---|---|---|---|
| Underlayer | Polymer compound 1 | P-6 | P-1 | P-1 | P-1 | P-1 | P-1 |
|  | Addition amount in coating solution (IV) | 2.8 parts | 3.5 parts | 1.8 parts | 2.5 parts | 2.8 parts | 3.32 parts |
| Interlayer | Polymer compound 2 | P-7 | Not present | P-7 | P-7 | P-7 | P-7 |
|  | Addition amount in coating solution (IV) | 0.7 parts | Not present | 1.7 parts | 1.0 part | 0.7 parts | 0.18 parts |
| Upper layer | Polymer compound 3 | P-12 | P-12 | P-12 | P-12 | P-12 | P-12 |
| Evaluation | Printing durability of UV ink (sheets) | 60000 | 60000 | 50000 | 60000 | 60000 | 60000 |
|  | Evaluation 1 of chemical resistance (scores) | 5 | 2 | 5 | 5 | 5 | 4 |
|  | Evaluation 2 of chemical resistance (scores) | 5 | 1 | 5 | 5 | 4 | 4 |
|  | Image formability (scores) | 5 | 5 | 5 | 5 | 4 | 4 |

TABLE 4

|  |  | Example 30 | Example 31 | Example 32 | Example 33 | Comparative Example 8 | Example 34 | Example 35 | Example 36 | Example 37 | Example 38 | Example 39 |
|---|---|---|---|---|---|---|---|---|---|---|---|---|
| Underlayer | Polymer compound 1 | P-1 | P-1 | P-1 | P-1 | P-1 | P-4 | P-4 | P-4 | P-4 | P-1 | P-1 |
|  | Addition amount in coating solution (IV) | 2.8 parts | 2.8 parts | 2.8 parts | 2.8 parts | 2.8 parts | 2.8 parts | 2.8 parts | 2.8 parts | 2.8 parts | 2.8 parts | 2.8 parts |
| Interlayer | Polymer compound 2 | P-8 | P-9 | P-10 | P-11 | P-4 | P-10 | P-8 | P-9 | P-9 | P-7 | P-7 |
|  | Addition amount in coating solution (IV) | 0.7 parts | 0.7 parts | 0.7 parts | 0.7 parts | 0.7 parts | 0.7 parts | 0.7 parts | 0.7 parts | 0.7 parts | 0.7 parts | 0.7 parts |
| Upper layer | Polymer compound 3 | P-12 | P-12 | P-12 | P-12 | P-12 | P-12 | P-12 | P-12 | P-4 | P-13 | P-4 |
| Evaluation | Printing durability of UV ink (sheets) | 60000 | 60000 | 60000 | 60000 | 60000 | 50000 | 60000 | 60000 | 60000 | 60000 | 60000 |
|  | Evaluation 1 of chemical resistance (scores) | 5 | 5 | 4 | 4 | 1 | 4 | 4 | 4 | 4 | 4 | 4 |
|  | Evaluation 2 of chemical resistance (scores) | 5 | 4 | 4 | 4 | 1 | 4 | 4 | 4 | 4 | 4 | 4 |
|  | Image formability (scores) | 5 | 5 | 5 | 4 | 4 | 5 | 5 | 5 | 5 | 5 | 5 |

As shown in the results listed in Tables 1 and 2, it was found that the lithographic printing plate precursors according to the embodiment of the present disclosure, each of which was obtained by coating the underlayer containing the polymer compound 1 with the interlayer containing the polymer compound 2 and further coating the interlayer with the upper layer containing the polymer compound 3, exhibited excellent UV ink printing durability, excellent chemical resistance, and image formability.

Further, in regard to the film thickness of the interlayer, in Examples 11 to 14 in which the film thickness thereof was 10 nm or greater, the lithographic printing plate precursors exhibited excellent chemical resistance.

As shown in the results listed in Tables 3 and 4, it was found that the lithographic printing plate precursors, each of which was obtained by applying the coating solution for forming an underlayer and the interlayer containing the polymer compound 1 and the polymer compound 2 of the present disclosure at a specific abundance ratio to form the underlayer and the interlayer and further applying the upper layer containing the polymer compound 3, exhibited excellent UV ink printing durability, excellent chemical resistance, and image formability.

Further, in Examples 26 to 29 in which the proportion of the polymer compound 1 in the coating solution for forming an underlayer and the interlayer was 50% by mass or greater with respect to the total mass of the polymer compounds, the lithographic printing plate precursors exhibited excellent printing durability.

The disclosure of JP2016-192050 filed on Sep. 29, 2017 and the disclosure of JP2017-054715 filed on Mar. 21, 2017 and the entirety thereof are incorporated in the present specification by reference.

All documents, patent applications, and technical standards described in the present specification are incorporated herein by reference to the same extent as in a case of being specifically and individually noted that individual documents, patent applications, and technical standards are incorporated by reference.

What is claimed is:

1. A positive type lithographic printing plate precursor comprising at least:
    a support which has a hydrophilic surface or a hydrophilic layer; and
    on the support, an underlayer, an interlayer, and an upper layer, in this order,
    wherein the underlayer contains a polymer compound 1 which is insoluble in water and soluble in an alkali aqueous solution and has at least one structure selected from the group consisting of a urethane bond, an acetal structure, and a urea bond in a main chain,
    the interlayer contains a polymer compound 2 which is insoluble in water and soluble in an alkali aqueous solution and has at least one structure selected from the group consisting of a sulfonamide group, an active imide group, and a urea bond in a side chain, the polymer compound 2 including at least one resin selected from the group consisting of an acryl resin containing a sulfonamide group in a side chain, a maleimide-acryl copolymer containing an active imide group in a side chain, and a novolac resin containing a urea bond in a side chain,
    the upper layer contains a polymer compound 3 which is insoluble in water and soluble in an alkali aqueous solution and has a phenolic hydroxy group, and
    one or more layers among the underlayer, the interlayer, and the upper layer contain an infrared absorbent.

2. The positive type lithographic printing plate precursor according to claim 1,
    wherein the underlayer further contains the polymer compound 2.

3. The positive type lithographic printing plate precursor according to claim 2,
    wherein the polymer compound 1 and the polymer compound 2 in the underlayer form a sea-island structure.

4. The positive type lithographic printing plate precursor according to claim 1,
    wherein the interlayer has a thickness of 5 nm or greater.

5. The positive type lithographic printing plate precursor according to claim 1,
    wherein the interlayer has a thickness of 10 nm or greater.

6. The positive type lithographic printing plate precursor according to claim 1,
    wherein the polymer compound 3 is at least one polymer compound selected from the group consisting of a phenol resin and an acetal resin containing a phenolic hydroxy group in a side chain.

7. The positive type lithographic printing plate precursor according to claim 1,
    wherein the polymer compound 3 is a novolac resin containing a phenolic hydroxy group.

8. The positive type lithographic printing plate precursor according to claim 1,
    wherein the upper layer contains an infrared absorbent.

9. The positive type lithographic printing plate precursor according to claim 1,
    wherein at least one of the underlayer, the interlayer, or the upper layer contains an onium salt compound.

10. A method of producing the positive type lithographic printing plate precursor according to claim 1, comprising:
    a step of preparing a coating solution which contains the polymer compound 1 and the polymer compound 2;
    a step of coating a support which has a hydrophilic surface or a hydrophilic layer with the coating solution and drying the coating solution to form an underlayer and an interlayer through phase separation; and
    a step of forming an upper layer on the interlayer.

11. The method of producing the positive type lithographic printing plate precursor according to claim 10,
    wherein an abundance ratio between the polymer compound 1 and the polymer compound 2 which are contained in the coating solution is in a range of 95:5 to 50:50 on a mass basis.

12. The method of producing the positive type lithographic printing plate precursor according to claim 10,
    wherein the abundance ratio between the polymer compound 1 and the polymer compound 2 which are contained in the coating solution is in a range of 90:10 to 60:40 on a mass basis.

13. A method of preparing a lithographic printing plate, comprising:
    an exposure step of imagewise-exposing the positive type lithographic printing plate precursor according to claim 1; and
    a development step of developing the exposed lithographic printing plate precursor using an alkali aqueous solution having a pH of 8.5 to 13.5.

* * * * *